United States Patent [19]

Koyama et al.

[11] Patent Number: 5,608,716

[45] Date of Patent: Mar. 4, 1997

[54] OPTICAL RECORDING/REPRODUCING APPARATUS INCLUDING A SEMICONDUCTOR LASER HAVING A PLURALITY OF RADIATIVE PORTIONS HAVING DIFFERENT PHYSICAL CHARACTERISTICS

[75] Inventors: Osamu Koyama, Yokohama; Takeshi Yamawaki, Tokyo, both of Japan

[73] Assignee: Canon Kabushiki Kaisha, Tokyo, Japan

[21] Appl. No.: 551,363

[22] Filed: Nov. 1, 1995

Related U.S. Application Data

[63] Continuation of Ser. No. 118,807, Sep. 9, 1993, abandoned.

[30] Foreign Application Priority Data

Sep. 14, 1992 [JP] Japan .................................. 4-269094

[51] Int. Cl.$^6$ ........................................................ G11B 7/00
[52] U.S. Cl. ................................ 369/275.1; 369/44.37; 369/122; 372/50; 257/82
[58] Field of Search .................................... 369/112, 121, 369/275.1, 122, 44.37, 109, 120, 44.28; 372/48, 49, 50, 45, 43; 257/82

[56] References Cited

U.S. PATENT DOCUMENTS

| | | | |
|---|---|---|---|
| 4,860,276 | 8/1989 | Ukita et al. | 369/119 |
| 4,955,030 | 9/1990 | Manigaux et al. | 372/44 |
| 4,971,415 | 11/1990 | Hara | 372/50 |
| 5,018,127 | 5/1991 | Ando | 369/112 |
| 5,071,786 | 12/1991 | Paoli | 437/129 |
| 5,105,410 | 4/1992 | Maeda et al. | 369/112 |
| 5,115,285 | 5/1992 | Menigaux et al. | 357/17 |
| 5,144,616 | 9/1992 | Yasukawa et al. | 369/122 |
| 5,181,161 | 1/1993 | Hirose et al. | 369/109 |
| 5,210,730 | 5/1993 | Hayashi et al. | 369/112 |
| 5,485,438 | 1/1996 | Koyama | 369/44.28 |
| 5,500,869 | 3/1996 | Yoshida et al. | 372/50 |

FOREIGN PATENT DOCUMENTS

| | | |
|---|---|---|
| 0061220 | 9/1982 | European Pat. Off. . |
| 0092420 | 10/1983 | European Pat. Off. . |
| 0097035 | 12/1983 | European Pat. Off. . |
| 0206642 | 12/1986 | European Pat. Off. . |
| 0254568 | 1/1988 | European Pat. Off. . |
| 0267839 | 5/1988 | European Pat. Off. . |

(List continued on next page.)

OTHER PUBLICATIONS

Patent Abstracts of Japan, Kokai No. 60–107885, vol. 9, No. 258, Oct. 1985.

Yamaguchi, "Monolithic 3–Beam Semiconductor Laser: Now a Practical Reality," Journal of Electronic Engineering, vol. 24, No. 248, Aug. 1987, pp. 54 through 56.

Patent Abstracts of Japan, Kokai No. 3–077387, vol. 15, No. 246, Jun. 1991.

Patent Absracts of Japan, Kokai No. 61–054688, vol. 10, No. 217, Jul. 1986.

*Primary Examiner*—Georgia Y. Epps
*Assistant Examiner*—Kim-Kwok Chu
*Attorney, Agent, or Firm*—Fitzpatrick, Cella, Harper & Scinto

[57] ABSTRACT

An optical recording/reproducing apparatus comprises a semiconductor laser having a plurality of radiative portions formed at different heights on a same substrate and a spot forming system for arranging beams from the plurality of radiative portions in the semiconductor laser to form a plurality of light spots on an information recording medium for effecting information record and reproduction. In the apparatus, the spot forming system concurrently forms a first recording light spot and a first reproducing light spot on a first information track on the information recording medium and concurrently forms a second recording light spot and a second reproducing light spot on a second information track different from the first information track on the information recording medium.

18 Claims, 36 Drawing Sheets

FOREIGN PATENT DOCUMENTS

| | | |
|---|---|---|
| 0380380 | 8/1990 | European Pat. Off. . |
| 0446070 | 9/1991 | European Pat. Off. . |
| 51-107121 | 9/1976 | Japan . |
| 54-146613 | 11/1979 | Japan . |
| 59-15219 | 1/1984 | Japan . |
| 61-222040 | 10/1986 | Japan . |
| 62-175948 | 8/1987 | Japan . |
| 63-268103 | 11/1988 | Japan . |
| 64-19535 | 1/1989 | Japan . |
| 64-82348 | 3/1989 | Japan . |
| 8702237 | 4/1988 | Netherlands . |

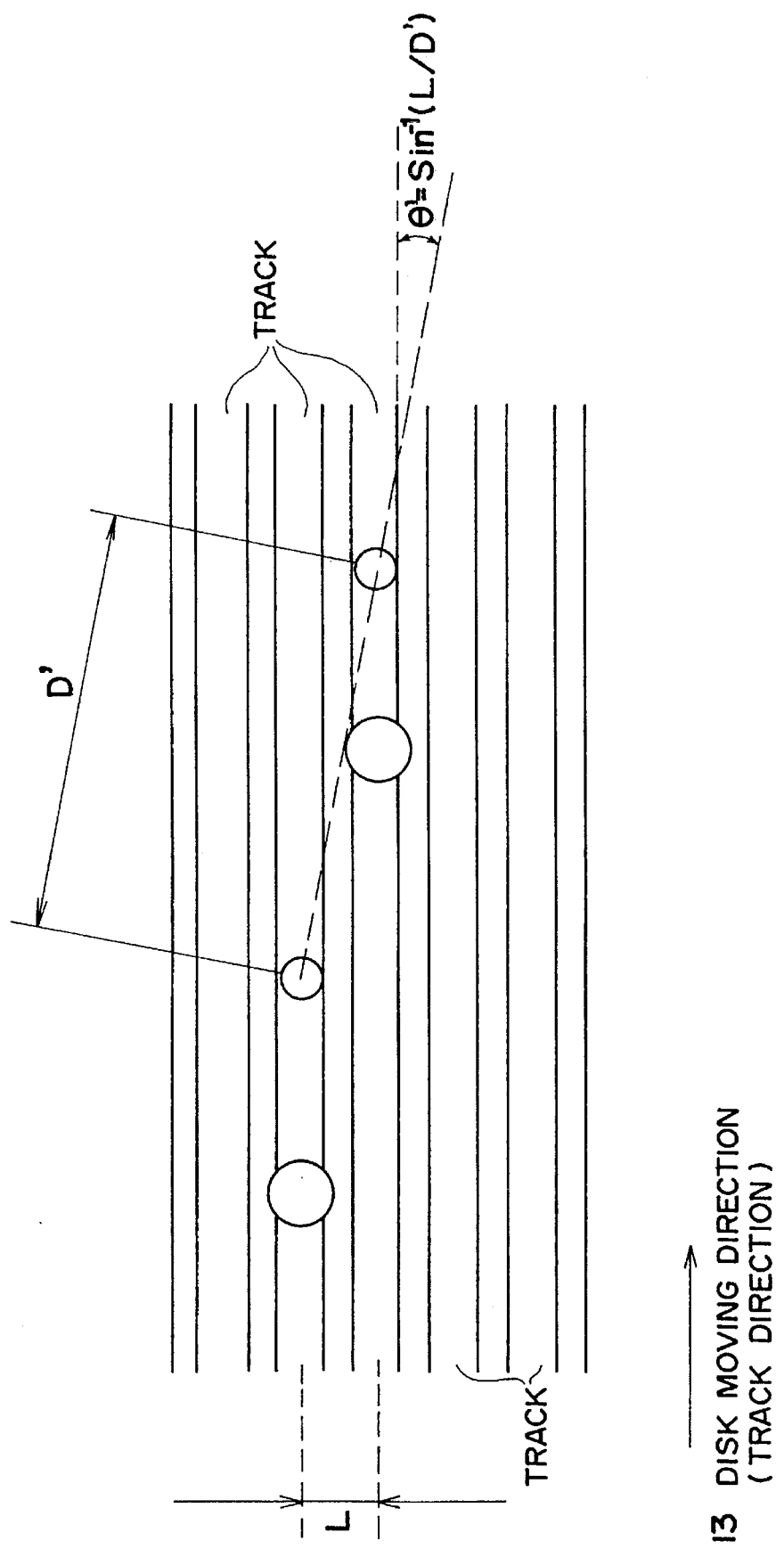

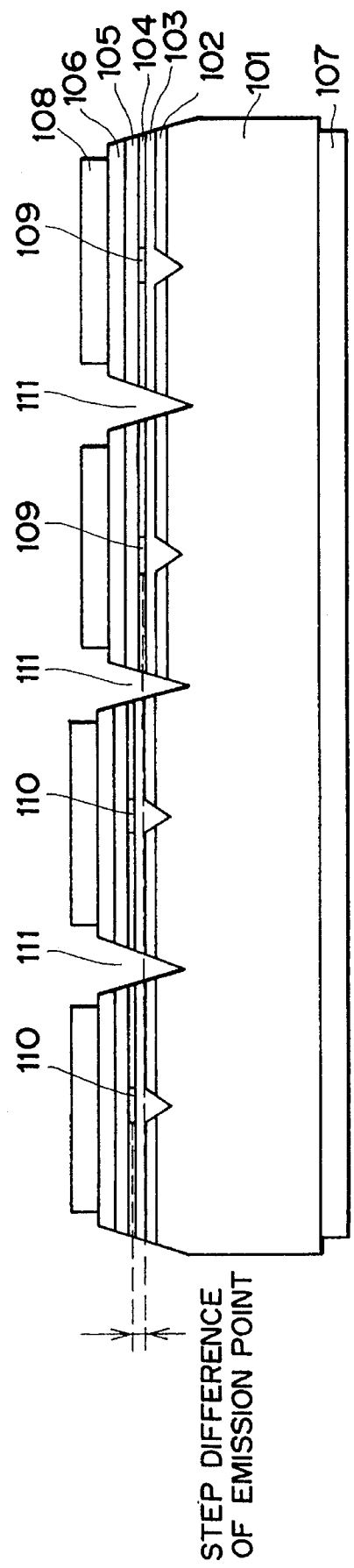

OPTICAL RECORDING/REPRODUCING APPARATUS INCLUDING A SEMICONDUCTOR LASER HAVING A PLURALITY OF RADIATIVE PORTIONS HAVING DIFFERENT PHYSICAL CHARACTERISTICS

This application is a continuation of prior application Ser. No. 08/118,807 filed Sep. 9, 1993, now abandoned.

BACKGROUND OF THE INVENTION

1. Field of the Invention

The present invention relates to an optical recording/reproducing apparatus such as an optical disk apparatus. More particularly, the invention relates to an optical recording/reproducing apparatus with a plurality of laser beam sources which can perform overwrite and reproduction for verification immediately after recording, substantially at the same time and in parallel. The optical recording/reproducing apparatus of the present invention is effectively applicable to magneto-optical recording/reproducing apparatus.

Also, the present invention relates to a semiconductor laser array which has a plurality of laser units on a single substrate and which can drive them independently of each other.

2. Related Background Art

Recent research and development has been vigorous for increasing the transfer rate of magneto-optical disk apparatus. Presently commercially available magneto-optical disk apparatus require three rotations of a disk for erasure, for recording and for reproduction (verification) in data writing, and have a drawback that the data transfer rate, especially in recording, is lower than that in use of a hard disk or the like. Then, there are various apparatus proposed, for example a recording/reproducing apparatus and a recording medium of overwrite type in which recording and erasure are carried out during a rotation of a disk, a recording/reproducing apparatus in which a plurality of light spots are formed to carry out verification right after recording, and an apparatus in which a plurality of light spots are formed to carry out recording and reproduction in parallel.

Proposed as an overwritable magneto-optical disk apparatus is one of a type in which a magnetic field applied to a magneto-optical recording medium is modulated according to record information, as described in Japanese Laid-open Patent Application No. 51-107121. In addition to that, another magneto-optical disk apparatus is proposed for example in Japanese Laid-open Patent Application No. 64-82348, in which a series of erasure-record-reproduction processes are finished during a rotation of a disk with beams for recording and for verification being located on a track. These are categorized as a magnetic field modulation overwrite method, because the magnetic field applied to the magneto-optical record medium is modulated according to record information. Also, there are record media which are overwritable by modulating a light beam for writing information into magneto-optical recording media, as proposed for example in Japanese Laid-open Patent Application No. 62-175948 or in Japanese Laid-open Patent Application No. 63-268103. These record media enable overwrite by the structure that multiple magnetic layers different in properties of Curie temperature and coercivity are exchange-coupled with each other. These are categorized as an optical modulation overwrite method.

Further, for example Japanese Laid-open Patent Application No. 54-146613 or Japanese Laid-open patent Application No. 64-19535 describes apparatus in which a plurality of light sources form a plurality of light spots on adjacent tracks on a recording medium to perform parallel recording/reproduction. These achieve parallel recording and reproduction by using a semiconductor laser array as a light source and an optical system almost identical to that in conventional magneto-optical disk apparatus using a single light source.

As described above, the magneto-optical disk apparatus can be improved to increase the data transfer rate up to that of a hard disk or more than that, utilizing the property that the optical system allows multiplex transmission of plural light beams.

If an attempt is made to execute overwrite and verification immediately after recording by a plurality of laser beam sources within a rotation of a disk and in parallel in order to further increase the transfer rate of the magneto-optical disk apparatus, combinations of conventional technology make the construction of an optical system too complex to achieve the attempt.

For electrophotographic printers or optical information recording/reproducing apparatus using a semiconductor laser as a light source, a method is being studied for simultaneous and parallel processing of a plurality of lines or a plurality of tracks with a plurality of laser beams and via a single optical system in order to improve the processing speed.

FIG. 1 is a schematic drawing to show an optical system in a conventional optical information recording/reproducing apparatus. In FIG. 1, reference numeral 112 denotes a light source, 113 a collimator lens, 114 a beam splitter, 115 an objective lens, 116 a record medium, 117 and 120 condenser lenses, 118 a light quantity detecting sensor, 119 a half-wave plate, 121 a cylindrical lens, 122 a polarization beam splitter, 123 a first signal detecting sensor, and 124 a second signal detecting sensor. A plurality of beams from the light source 12 are aligned in the direction of arrows 125 in FIG. 1. Each beam emitted from the light source 112 is split into two by the beam splitter 114, reflected light thereby passes through the condenser lens 117 to be focused on the light quantity detecting sensor 118. A light quantity of each beam is detected by a sectioned light receiving portion (not shown) for each beam. Transmitted light by the beam splitter 114 is converged by the objective lens 115 to form a spot on the record medium 116, with which information recording or reproduction is carried out. Reflected light by the record medium 116 is again reflected by the beam splitter 114, and a plane of polarization of the reflected light is rotated by 45 degrees by the half-wave plate 119. Then, the light is guided to pass through the condenser lens 120 and the cylindrical lens 121 to form astigmatic beams. The polarization beam splitter 122 further guides the beams to the first and second signal detecting sensors 123, 124. A light receiving surface (not shown) of a first or second signal detecting sensor is so divided as to independently receive the plural beams of reflected light corresponding to the beams from the light source 112. In particular, one of the sensor units in the first signal detecting sensor is formed as a quarter-sectioned sensor, which detects a track deviation and a defocus amount of a beam converged from an astigmatic beam onto the record medium. The first and second signal detecting sensors reproduce information recorded in the record medium by detecting a differential output between two separate light receiving portions, which are for detecting respective beams from a same beam. A permanent magnet 90 applies an external magnetic field as an auxiliary magnetic field to a micro region of a beam spot in an information record.

FIG. 2 shows a positional relation between the beams and the tracks on the record medium. Each of the beams from the light source 112 is positioned on a track of the record medium, and the lasers emitting the beams are operated independent of each other, which enables parallel recording and reproduction of up to the number of beams.

Since return light from the record medium is coupled with the original beam in reproduction and thereby causes return light induced noises, a measure is normally employed for reducing the coherence of the laser by providing an external high-frequency overlay circuit.

It is important that the light source employed in such an apparatus shown in FIG. 1 have a high output power and even properties of laser beams, in order that each laser for emitting a beam is effective for recording and reproduction. A conventional light source used for such a purpose is a semiconductor laser array integrated on a single substrate in the monolithic manner. FIG. 3 shows the structure of a conventional semiconductor laser array. This is an example of a semiconductor laser array of an inner strip type produced by the liquid phase epitaxy (LPE).

In FIG. 3, reference number 101 designates a p-type GaAs substrate for crystal growth thereon, 102 an n-type GaAs current block layer for current constriction in the inner stripe structure, 103, 104, 105 a p-type AlGaAs first clad layer, an AlGaAs active layer, and an n-type AlGaAs second clad layer, respectively, constituting a double heterojunction, 106 an n-type GaAs cap layer, 107, 108 electrodes, 110 an integrated laser emission portion, and 111 a separation groove for enabling independent drive of the integrated lasers.

The production process of the semiconductor laser array is next described.

First crystal growth is carried out to form a block layer 102 on a flat substrate 101. Etching is next done to form grooves for inner stripes, whereby the block layer 102 has stripes in width (W2) at intervals of about 100 μm and grooves in depth reaching the substrate 101. Next, second crystal growth is carried out to form layers 103–106. The first clad layer 103 is formed while preferentially filling up the etched grooves, which is the property of liquid phase epitaxy, and has a substantially flat surface above the grooves. Accordingly, the active layer 104, the second clad layer 105 and the cap layer 106 above the third layer are also formed in a substantially parallel layer to the substrate 101 by crystal growth. The first and second clad layers and the active layer 104 therebetween form a double heterojunction to be a laser waveguide. Then, a separation groove 111 is formed to electrically separate the integrated laser waveguides from each other by etching the middle portion between radiative portions 110 from the top of cap layer 106 to the substrate 101. A cathode electrode 108 is formed on each of the n-type cap layers 106 separated by the separation groove 111, while an anode electrode 107 is formed on the bottom of the p-type substrate 101.

The conduction type of each layer may be reversed in the above semiconductor layer array.

When a voltage is applied between the electrodes, a current flowing between the electrodes is constricted by the block layer 102. The constricted current is efficiently injected into the limited active layer region on the groove to oscillate the laser. A radiative portion 110 is in the active layer 104 while being located above the etched groove in the block layer 102. Since the cathode electrodes 108 on the cap layers 106 are separated from each other by the separation groove 111, an arbitrary laser may be independently driven by turning on and off a corresponding cathode electrode. The far field pattern FWHM (full-width at half maximum) beam divergence angle in the direction parallel to the junction plane ($\Theta\|$) is generally determined by the stripe width while the far field pattern FWHM beam divergence angle in the direction normal to the junction plane ($\Theta\bot$) is generally determined by the thickness of the active layer. $\Theta\|$ is designed to be about 9 degrees in order to obtain a high output property over 30 mW necessary for recording and to decrease the astigmatic difference in low output. Also, $\Theta\bot$ is often designed to be below about 25 degrees to obtain the high output property. As described above, the conventional semiconductor laser array can provide beams with high output and equal property, and therefore is used as a light source effective for parallel processing in electrophotographic printers or in optical information recording/reproducing apparatus.

The conventional semiconductor laser array, however, has such an arrangement that high output lasers having the same property of a rated output of about 30 mW are integrated therein, and is evaluated as to the low output property in reproduction by the characteristics shown upon operation of the high output lasers at about 3 mW. A high output laser needs to have an increased stripe width in order to assure the high output property necessary for recording, which causes a problem of increase in astigmatic difference upon low output operation. Also, since the wavelength of the laser becomes longer in proportion to the operation current, there is a wavelength difference between a recording beam and a reproducing beam of about 3–5 nm. If the beams are focused through the same optical system onto a track, the variation of astigmatic difference or the wavelength difference will cause relative defocus or degradation of recording or reproduction quality.

In addition, since the noise property is considerably degraded by the coupling of the laser beam with return light in reproduction, the external high-frequency modulation is necessary, which requires an extra circuit.

It is an object of the present invention to provide a semiconductor laser array most suitable to increase the transfer rate of an optical information recording/reproducing apparatus. Specifically, two beams are positioned on a same track, a forward beam of which is used for recording and a following beam of which is for reproduction. This arrangement enables the verification operation immediately after recording, which omits the rotation wait time so as to increase the transfer rate.

FIG. 4 shows the construction of another conventional semiconductor laser array which can be used in the apparatus shown in FIG. 1. In FIG. 4, the same portions are denoted by the same reference numerals as those in FIG. 3. The semiconductor laser array of FIG. 4 is different from that of FIG. 3 in that the array has four laser units, and may be produced in the same manner.

FIG. 5 shows the positional relation between tracks and beam spots on a record medium in a case of this semiconductor laser array being used. If a beam spacing is D between beam spots from the light source 112 and if the track pitch of the record medium is L, a laser beam can be positioned on each track when a line of the spots is rotated by $\Theta = \sin^{-1}(L/D)$ with respect to the track direction. The laser units emitting respective beams can be controlled independent of each other, so that recording or reproduction can be carried out in parallel in the number of beams.

Since all radiative points are arranged at the same height from the same substrate in the above conventional example, they are aligned on a straight line on the record medium, which is convenient for parallel processing of all radiative points. This arrangement, however, never permits at least two radiative points to be located on a same track and other radiative points to be located on a track adjacent to the track. The optical information recording/reproducing apparatus needs erasure, recording and reproduction processes for a recording operation, so that three rotations of a disk are necessary at maximum for completing the recording operation. A method for completing the erasure, recording and reproduction processes within a rotation of a disk is to perform consecutive processes thereof with two spots being positioned on a same track.

SUMMARY OF THE INVENTION

It is an object of the present invention to provide a monolithic semiconductor laser array which enables completion of a recording operation within a disk rotation with two spots being positioned on a same track and which also enables parallel processing over a plurality of tracks.

The present invention provides an optical recording/reproducing apparatus for information recording and reproduction in which beams from a plurality of semiconductor laser sources are guided through an optical system to form fine light spots on a plurality of predetermined tracks on an optical recording medium, wherein when radiative portions in said semiconductor laser sources are imaged through the optical system a plurality of images thereof are aligned substantially in the track direction such that at least two out of the plurality of radiative portions have a different coordinate value in the direction perpendicular to the track direction from that of the other radiative portions, wherein light spots corresponding to arbitrary two or more radiative portions out of the laser sources are formed on a first track by the said optical system for focusing the beams from the laser sources onto the optical record medium, and wherein light spots corresponding to the other two or more radiative portions out of the laser sources are formed on at least a track including a second track other than the first track.

Also, the present invention provides a semiconductor laser array of inner stripe type with a plurality of laser units formed on a same substrate as can be driven independently of each other, in which the plurality of laser units are different in stripe width.

Further, the present invention provides a semiconductor laser array with a plurality of laser units formed on a same substrate as can be driven independent of each other, in which the plurality of laser units comprise a low-output laser unit having a saturable absorption region in waveguide and a high-output laser having no saturable absorption region in waveguide.

Furthermore, the present invention provides a semiconductor laser array of double heterojunction type with a plurality of laser units formed on a same substrate as can be driven independent of each other, in which the plurality of laser units are different in height from the bottom surface of a substrate to an active layer.

BRIEF DESCRIPTION OF THE DRAWINGS

FIG. 39 is a drawing to show a positional relation between laser beams and tracks;

FIG. 40 is a drawing to show an embodiment of a semiconductor laser array of the present invention.

DETAILED DESCRIPTION OF THE PREFERRED EMBODIMENTS

The first embodiment of the optical recording/reproducing apparatus according to the present invention is first described with reference to FIG. 6 to FIG. 9.

Figure 6:
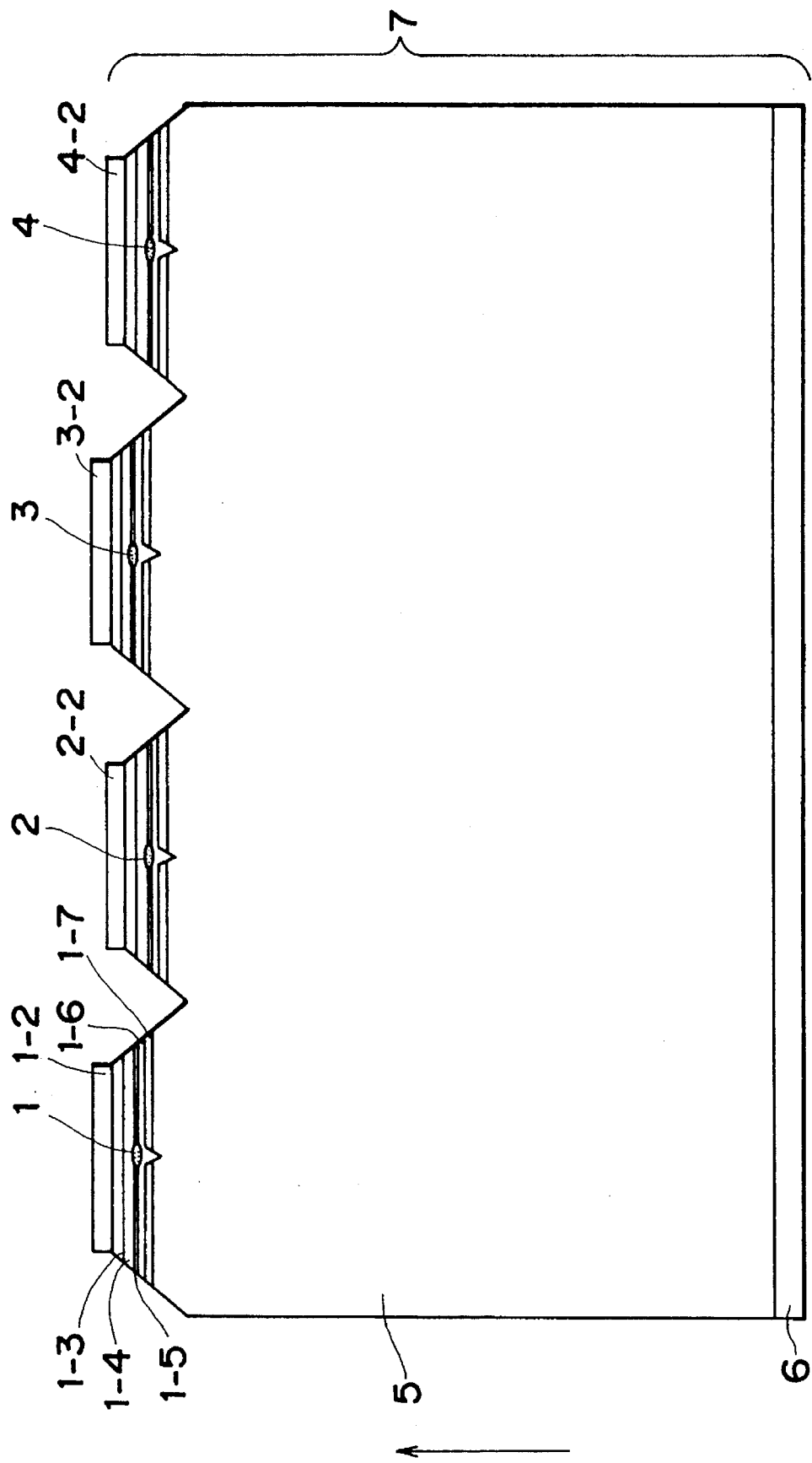
FIG. 6 is a constitutional drawing to show a semiconductor laser array as a light source portion in a magneto-optical disk apparatus of the present invention.

FIG. 6 shows the construction of a semiconductor laser array, which is a light source portion in a magneto-optical disk apparatus of the present invention. A semiconductor laser array chip 7 has four radiative points 1 to 4 for example. The four radiative points are formed for example on a same n-type GaAs substrate 5. The substrate has two different heights in the direction of the arrow. The semiconductor laser structure of a typical inner stripe type is formed on the substrate. The chip structure of each semiconductor laser is now described with one including the radiative point 1. Reference numeral 1-2 designates a positive electrode, 1-3 a cap layer for example of p-type GaAs, 1-4 an upper clad layer of p-type GaAlAs, 1-5 an active layer of n-type GaAlAs, 1-6 a lower clad layer of n-type GaAlAs, 1-7 a current block layer of p-type GaAlAs, and 6 a negative electrode. The lasers including respective radiative points 2 to 4 have the same chip structure. V-shape grooves provided between the radiative points are for cutting off thermal crosstalk and electric crosstalk between adjacent radiative points.

Figure 7:
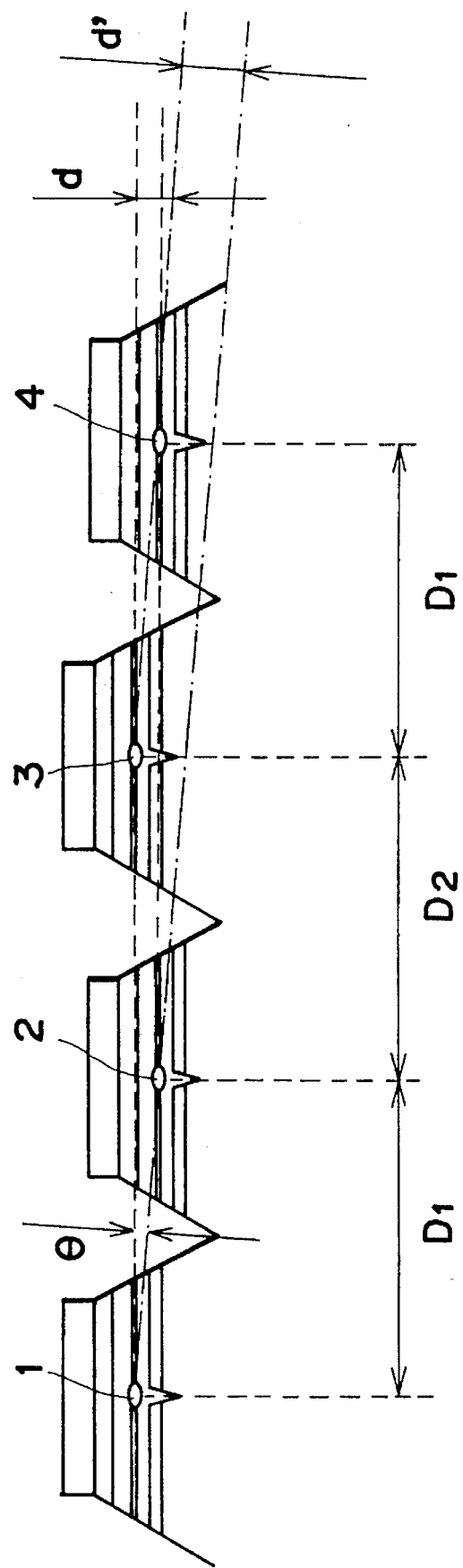
FIG. 7 is a detailed drawing to show the radiative portion of FIG. 6.

The radiative point portion in the semiconductor laser array 7 of inner stripe type as described above is further described in detail with FIG. 7. As shown in FIG. 7, the four radiative points 1 to 4 are so arranged that for example radiative points 1 and 3 are formed at a same height on the substrate while radiative points 2 and 4 are at another same height on the substrate, where a relative difference between the two heights is d, a distance between radiative points 1 and 2 and a distance between radiative points 3 and 4 are $D_1$, and a distance between radiative points 2 and 3 is $D_2$. The distances $D_1$ and $D_2$ may be equal to each other. Let a distance between a line connecting the radiative points 1 and 2 and a line connecting the radiative points 3 and 4 be d'. If d is sufficiently small as compared with the distances $D_1$, $D_2$, then d' can be expressed by the following equation:

$$d' \approx (D_1+D_2)\sin\Theta = \{(D_1+D_2)/D_1\}d \qquad (1).$$

Figure 8:
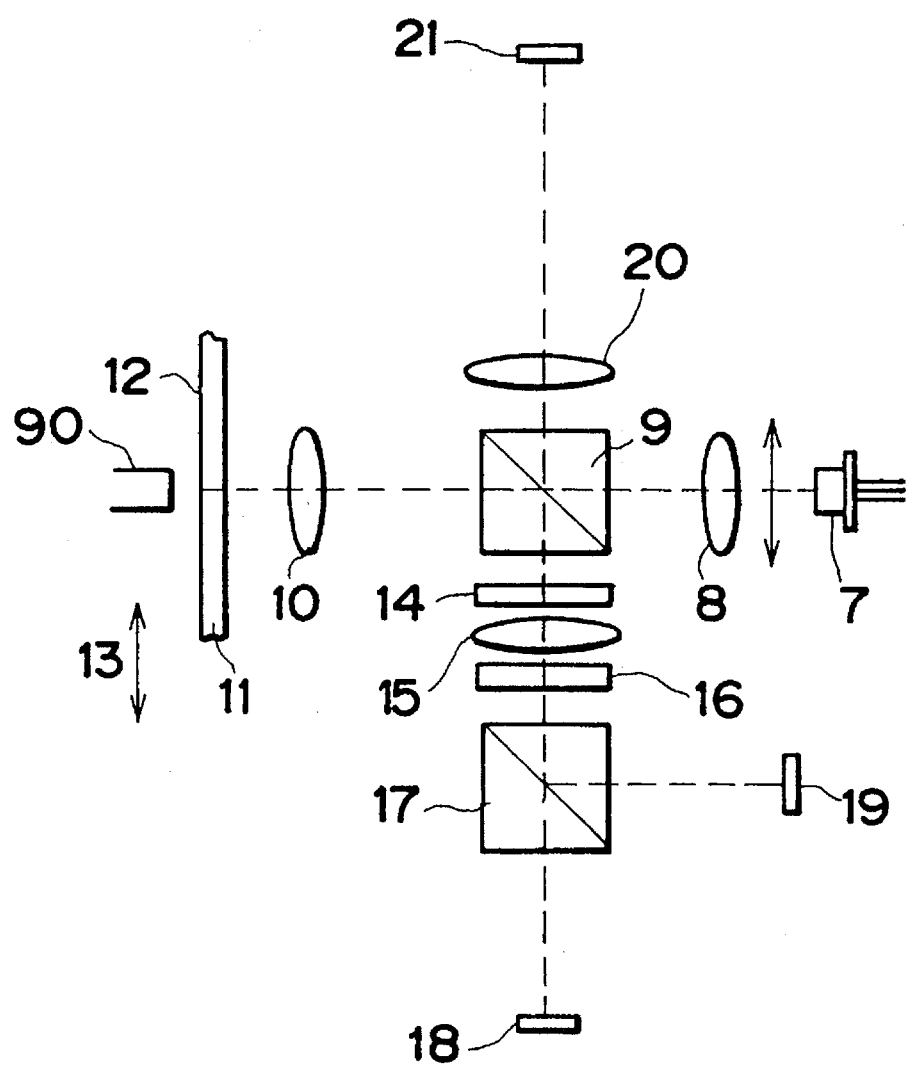
FIG. 8 is a drawing to show an optical system in a magneto-optical disk apparatus of the present invention.

FIG. 8 is a constitutional drawing to show a magneto-optical disk apparatus using the semiconductor laser array 7 shown in FIGS. 6 and 7 as a light source. Beams emitted from the semiconductor laser array 7 are collimated by a collimator lens 8 then to pass through a polarization beam splitter 9 and are imaged by an objective lens 10 in four fine light spots on a magnetic layer surface 12 of a magneto-optical disk 11, which is overwritable by the optical modulation method for example. Arrows 13 represent the track direction of the magneto-optical disk.

Figure 9:
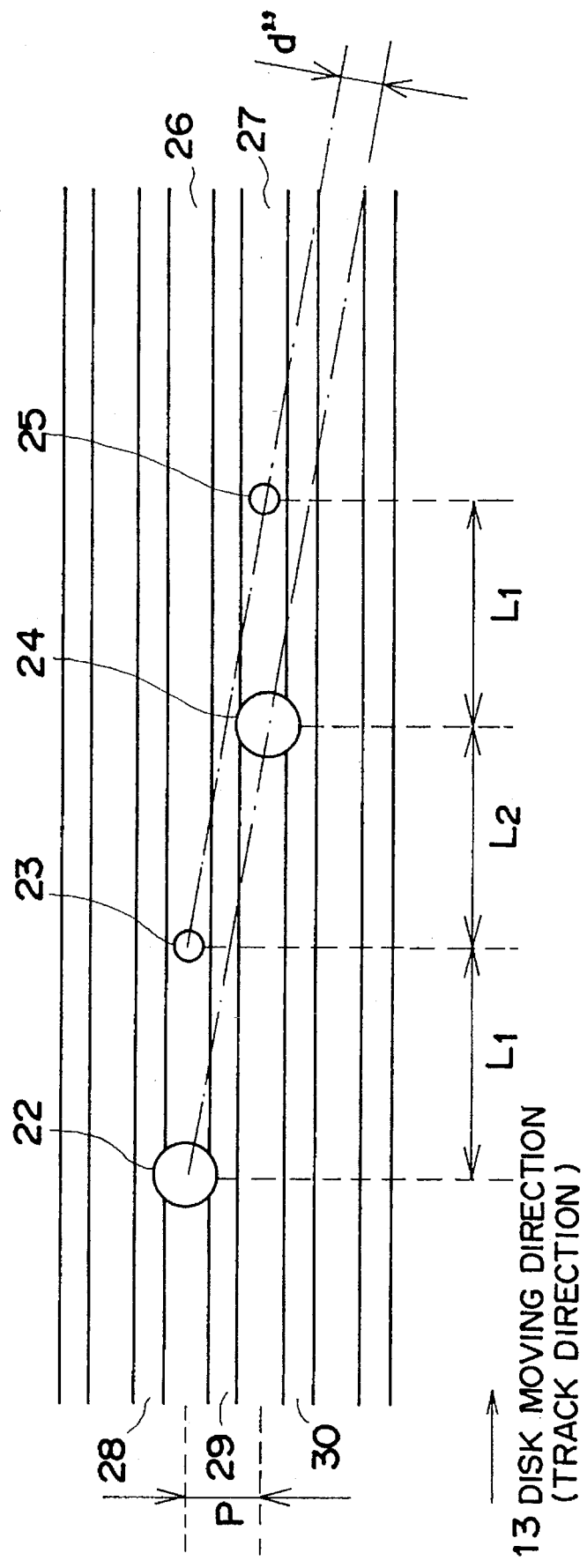
FIG. 9 is a drawing to show an arrangement of light spots on a magneto-optical disk.

The light spot on the magneto-optical disk 11 are now described with reference to FIG. 9. Images of the radiative points 1 to 4 are formed as fine light spots 22–25 on arbitrary adjacent tracks 26 and 27 through the optical system shown in FIG. 8. The radiative point 1 corresponds to the light spot 22 for overwrite on the track 26, the radiative point 2 to the light spot 23 for direct verification on the track 26, the radiative point 3 to the light spot 24 for overwrite on the track 27, and the radiative point 4 to the light spot 25 for direct verification on the track 27. Numerals 28–30 are guide grooves for tracking, and a pitch between tracks is represented by P. The light spots 22, 23 and the light spots 24, 25 can be located on the adjacent tracks for example by rotating the semiconductor laser array 7 shown in FIG. 8 by a slight angle Θ with respect to the track direction 13. The beams emitted from the semiconductor laser array 7 are polarized in the arrow direction in the plane of FIG. 8. Thus, if the polarization beam splitter selected has the property to reflect almost 100% of s-polarized light, the beams emitted from the semiconductor laser array 7 will have the direction of polarization nearly parallel to the track direction 13 on the magneto-optical disk 11.

The two sets of light spots can be positioned on the adjacent tracks by setting values for the optical system as follows. When the collimator lens has a focal length $f_1$ and the objective lens a focal length $f_2$, a lateral magnification of the optical system is $f_2/f_1$. Thus, a radial distance between the light spots may be approximately given by the following equation.

$$d'(f_2/f_1) = \{(D_1+D_2)/D_1\}d(f_2/f_1) = P \qquad (2)$$

Accordingly, if the pitch P between tracks is preliminarily determined, the difference d is given by the following equation.

$$d = \{D_1/(D_1+D_2)\}(f_1/f_2)P \qquad (2')$$

The level difference d=2 μm for example if P=1.5 μm, $f_1$=8 mm, $f_2$=3 mm and $D_1$=$D_2$=80 μm. The rotation angle η is about 1.4°. Incidentally, d" in FIG. 9 corresponds to d' in FIG. 7 imaged on the magneto-optical disk 11 by the optical system shown in FIG. 8 [i.e., $d''=(f_2/f_1)d'=P$].

The following equations give distances $L_1$, $L_2$ between the light spots in the track direction.

$$L_1 = (f_2/f_1)D_1 \qquad (3)$$

$$L_2 = (f_2/f_1)D_2 \qquad (4)$$

$L_1=L_2=30$ μm for example if $D_1=D_2=80$ μm, f=8 mm and $f_2=3$ min.

Supposing the magneto-optical disk 11 is one of overwritable by the optical modulation method as proposed in Japanese Laid-open Patent Application No. 63-268103, the light spots 22 and 24 can write information on the respective tracks 26, 27 with light pulses of binary $P_1$ and $P_2$ ($P_1>P_2$) of relatively high power in overwriting and under an auxiliary magnetic field from a permanent magnet 90 for application of a bias magnetic field. Magneto-optical pits are formed with perpendicular magnetization, which could be oriented in two directions opposite to each other in accordance with the power ($P_1$, $P_2$) of the light pulses. The light spots 23 and 25 reproduce (directly verify) the information written by the light spots 22 and 24 immediately after recording, with a relatively low power of constant value $P_3$ ($P_2 > P_3$). Each of $P_1$–$P_3$ represents a quantity of light on the magneto-optical disk 11.

Further, the second embodiment of the optical recording/reproducing apparatus of the present invention will be described referring to FIG. 10 and FIG. 11.

Figure 10:
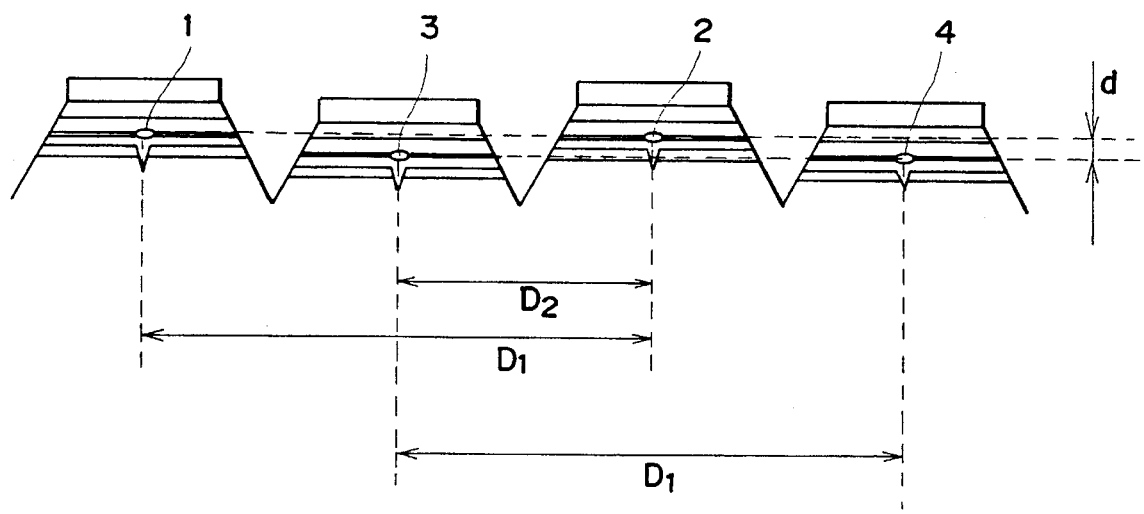
FIG. 10 is a drawing to show an embodiment of a semiconductor laser array.
Figure 11:
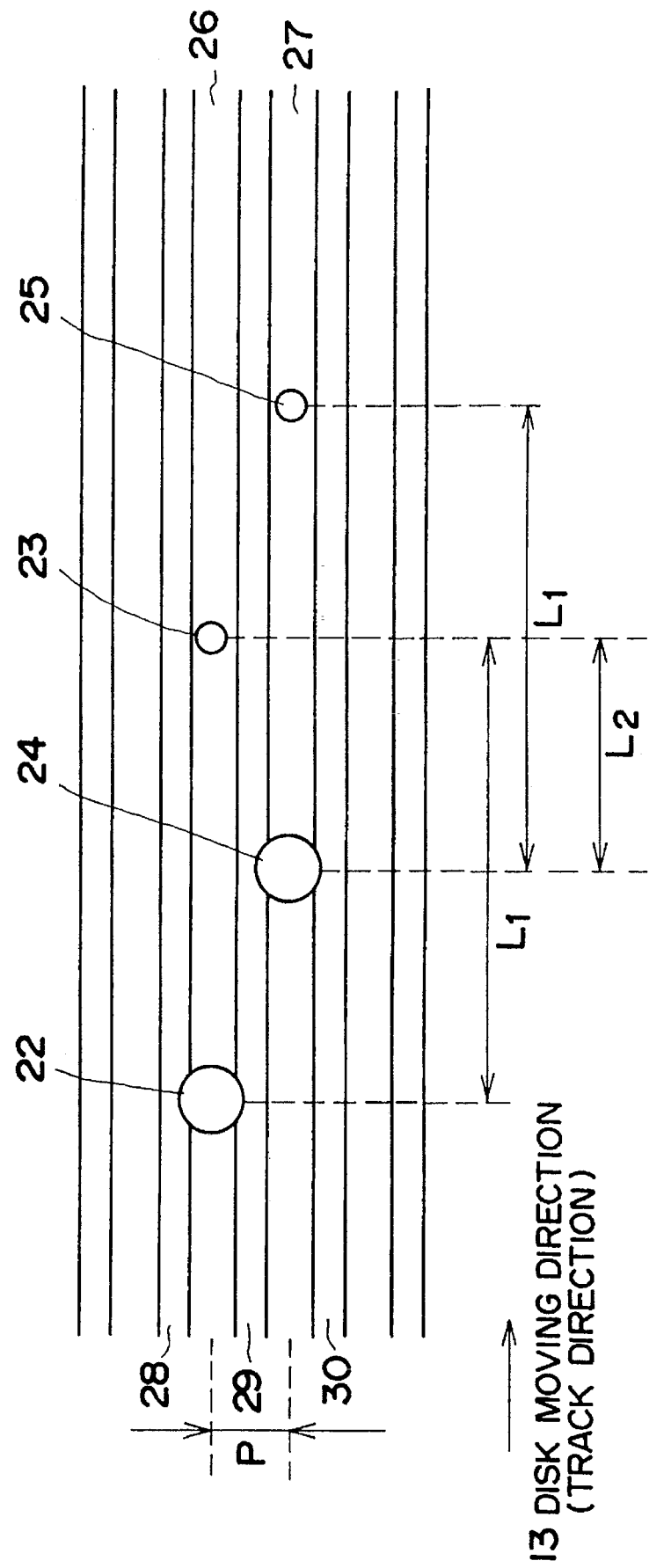
FIG. 11 is a drawing to show an arrangement of light spots on a magneto-optical disk.

FIG. 10 shows the construction of another semiconductor laser array, which is the light source portion of the magneto-optical disk apparatus of the present invention. A semiconductor laser array chip 7 has radiative points 1 to 4, which are denoted by the same numerals as the radiative points having the same functions in FIG. 7. The four radiative points are formed for example on an n-type GaAs substrate 5, similarly as in FIG. 6, and have two different heights, between which there is a difference d. The structure of each semiconductor laser is the same as that in FIG. 6. The four radiative points 1–4 are arranged for example such that radiative points 1 and 2 are formed at a same height on the substrate while radiative points 3 and 4 are at another same height on the substrate, as shown in FIG. 10. A distance between the radiative points 1 and 2 and a distance between the radiative points 3 and 4 are $D_1$, and a distance between the radiative points 2 and 3 is $D_2$.

The light spots on the magneto-optical disk 11 are next described with reference to FIG. 11, where the semiconductor laser array 7 as shown in FIG. 10 is set in the magneto-optical disk apparatus of FIG. 8.

The optical system in FIG. 8 forms images of the radiative points 1 to 4 as fine light spots 22 to 25 on arbitrary adjacent tracks 26 and 27. The radiative point 1 corresponds to the light spot 22 for overwrite on the track 26 in FIG. 10, the radiative point 2 to the light spot 23 for direct verification on the track 26, the radiative point 3 to the light spot 24 for overwrite on the track 27, and the radiative point 4 to the light spot 25 for direction verification on the track 27. Numerals 28–30 denote guide grooves for tracking, and a pitch between tracks is represented by P. The light spots 22, 23 and the light spots 24, 25 can be positioned on the adjacent tracks, respectively, for example by making the semiconductor laser array 7 in FIG. 8 coincident with the track direction 13. The beams emitted from the semiconductor laser array 7 are polarized in the arrow direction in the plane of FIG. 8, and the direction of polarization thereof is parallel to the track direction 13 on the magneto-optical disk 11.

As described above, the radiative points 1 to 4 of the semiconductor laser are arranged approximately in the track direction such that out of the radiative portions 1, 2 have coordinates different from those of the other radiative portions 3, 4 in the direction perpendicular to the tracks and that light spots corresponding to the radiative portions 1, 2 and light spots corresponding to the radiative portions 3, 4 are formed on a first track and on a second track different from the first track, respectively, by the optical system for focusing the beams from the light source onto the optical record medium.

The two sets of light spots can be positioned on the adjacent tracks by setting values for the optical system as follows. When the collimator lens has a focal length $f_1$ and the objective lens a focal length $f_2$, a lateral magnification of the optical system is $f_2/f_1$. Thus, a radial distance between the light spots is given by the following equation.

$$d(f_2/f_1) = P \quad (5)$$

Accordingly, if the pitch P between tracks is preliminarily determined, the difference d is obtained as follows.

$$d = (f_1/f_2)P \quad (5')$$

The difference $d = 4$ μm for example if $P = 1.5$ μm, $f_1 = 8$ mm, and $f_2 = 3$ mm. Distances between the spots in the track direction are calculated by Equations (3) and (4). $L_1 = 60$ μm and $L_2 = 30$ μm for example if $D_1 = 160$ μm, $D_2 = 80$ μm, $f_1 = 8$ mm and $f_2 = 3$ mm.

The light spots 22–25 function on the magneto-optical disk 11 in the same manner as in the first embodiment.

Figure 12:
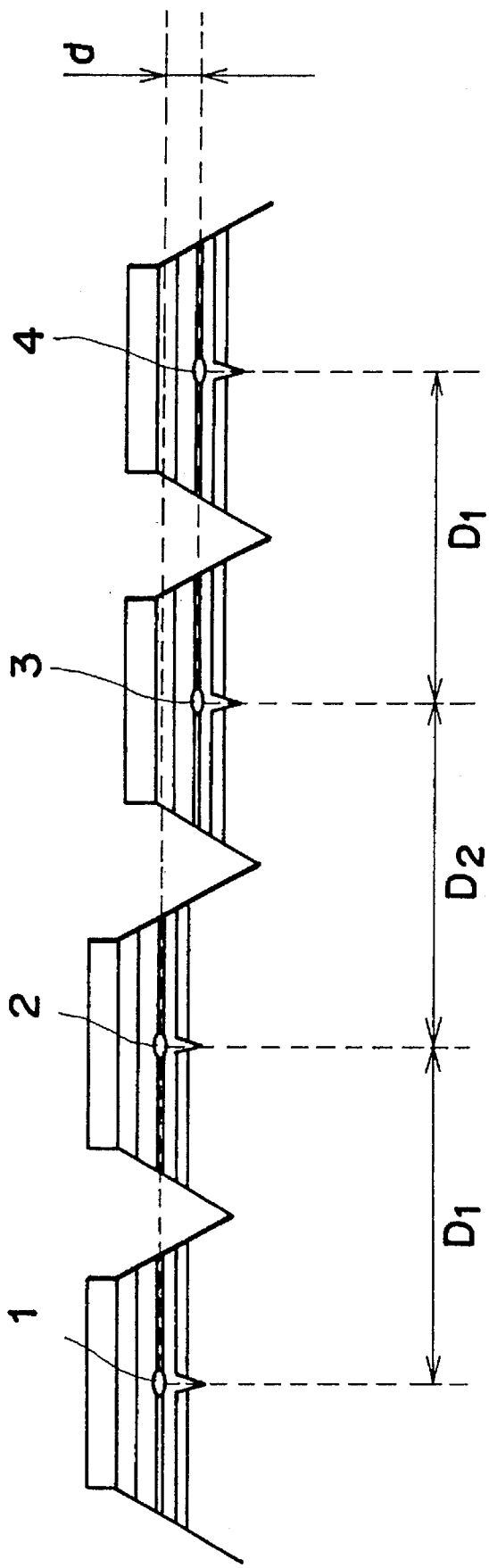
FIG. 12 is a drawing to show an embodiment of a semiconductor laser array.
Figure 13:
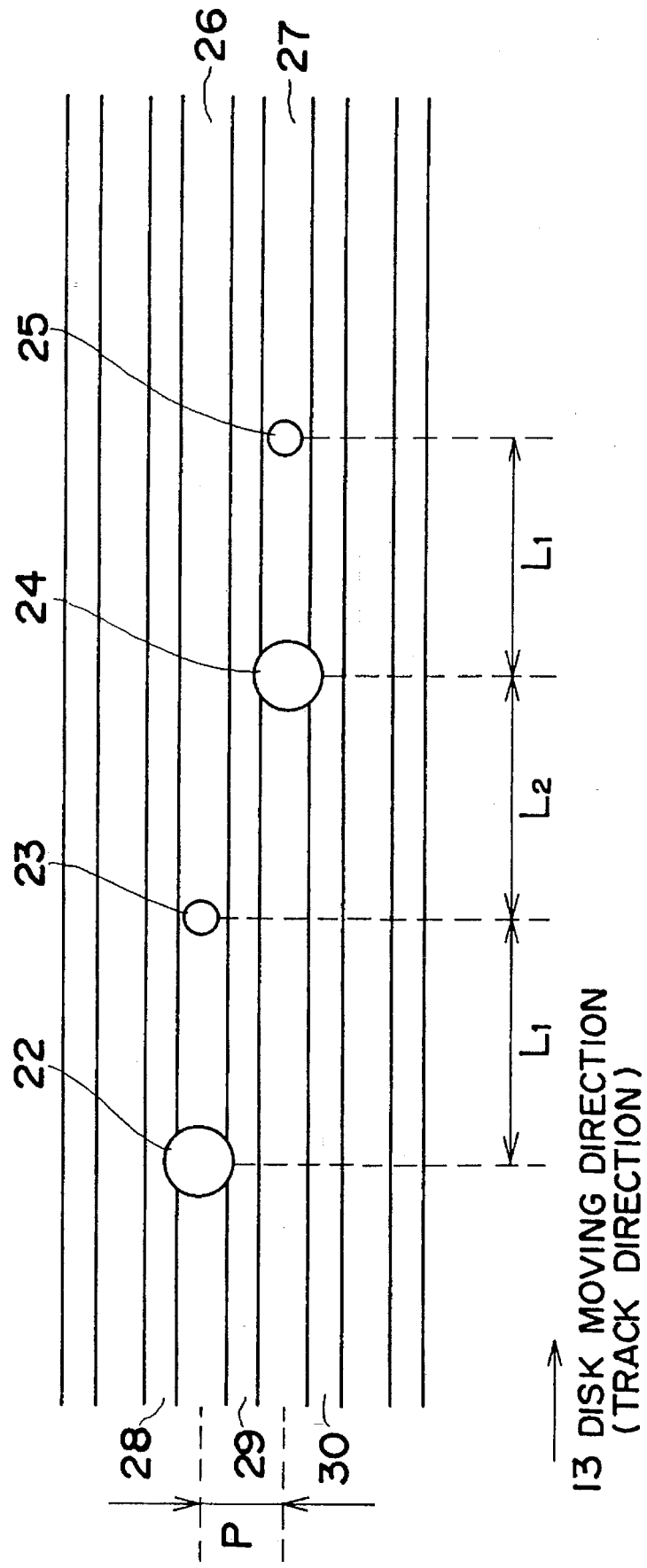
FIG. 13 is a drawing to show an arrangement of light spots on a magneto-optical disk.

Further, the third embodiment of the optical recording/reproducing apparatus of the present invention is described referring to FIG. 12 and FIG. 13.

FIG. 12 shows the construction of another semiconductor laser array, which is the light source portion in the magneto-optical disk apparatus of the present invention. A semiconductor laser array chip 7 has radiative points 1 to 4, which are denoted by the same numerals as those having the same functions in FIG. 7. The four radiative points are formed for example on an n-type GaAs substrate 5, similarly as in FIG. 6, and have two different heights, between which there is a difference d. The structure of each semiconductor laser chip is the same as that in FIG. 6. The four radiative points 1 to 4 are arranged for example such that radiative points 1 and 2 are formed at a same height on the substrate while radiative points 3 and 4 are at another same height on the substrate, as shown in FIG. 12. A distance between the radiative points 1 and 2 and a distance between the radiative points 3 and 4 are $D_1$, and a distance between the radiative points 2 and 3 is $D_2$.

The light spots on the magneto-optical disk 11 are next described with reference to FIG. 13, where the semiconductor laser array as shown in FIG. 12 is set in the magneto-optical disk apparatus of FIG. 8.

The optical system of FIG. 8 forms images of the radiative points 1–4 as fine light spots 22–25 on arbitrary adjacent tracks 26 and 27. The radiative point 1 corresponds to the light spot 22 for overwrite on the track 26, the radiative point 2 to the light spot 23 for direct verification on the track 26, the radiative point 3 to the light spot 24 for overwrite on the track 27, and the radiative point 4 to the light spot 25 for direct verification on the track 27. Numerals 28–30 denote guide grooves for tracking, and a pitch between tracks is represented by P. The light spots 22, 23 and the light spots 24, 25 can be positioned on the adjacent tracks, respectively, for example by making the semiconductor laser array 7 in FIG. 8 coincident with the track direction 13. The beams emitted from the semiconductor laser array 7 are polarized in the arrow direction in the plane of FIG. 8, and the direction of polarization thereof is parallel to the track direction 13 on the magneto-optical disk 11.

The two sets of light spots can be positioned on the adjacent tracks by setting values for the optical system as follows. When the collimator lens has a focal length $f_1$ and the objective lens a focal length $f_2$, a lateral magnification of the optical system is $f_2/f_1$. Thus, a radial distance between the optical spots is given by Equation (5). From Equation (5'), the distance $d = 4$ μm for example if $P = 1.5$ μm, $f_1 = 8$ mm, and $f_2 = 3$ mm. Distances between the spots in the track direction can be obtained by Equations (3) and (4). $L_1 = L_2 = 30$ μm for example if $D_1 = D_2 = 80$ μm, $f_1 = 8$ mm and $f_2 = 3$ mm.

The light spots 22–25 function on the magneto-optical disk 11 in the same manner as in the first embodiment.

Further, the fourth embodiment of the optical recording/reproducing apparatus of the present invention is described below referring to FIG. 14 and FIG. 15.

Figure 14:
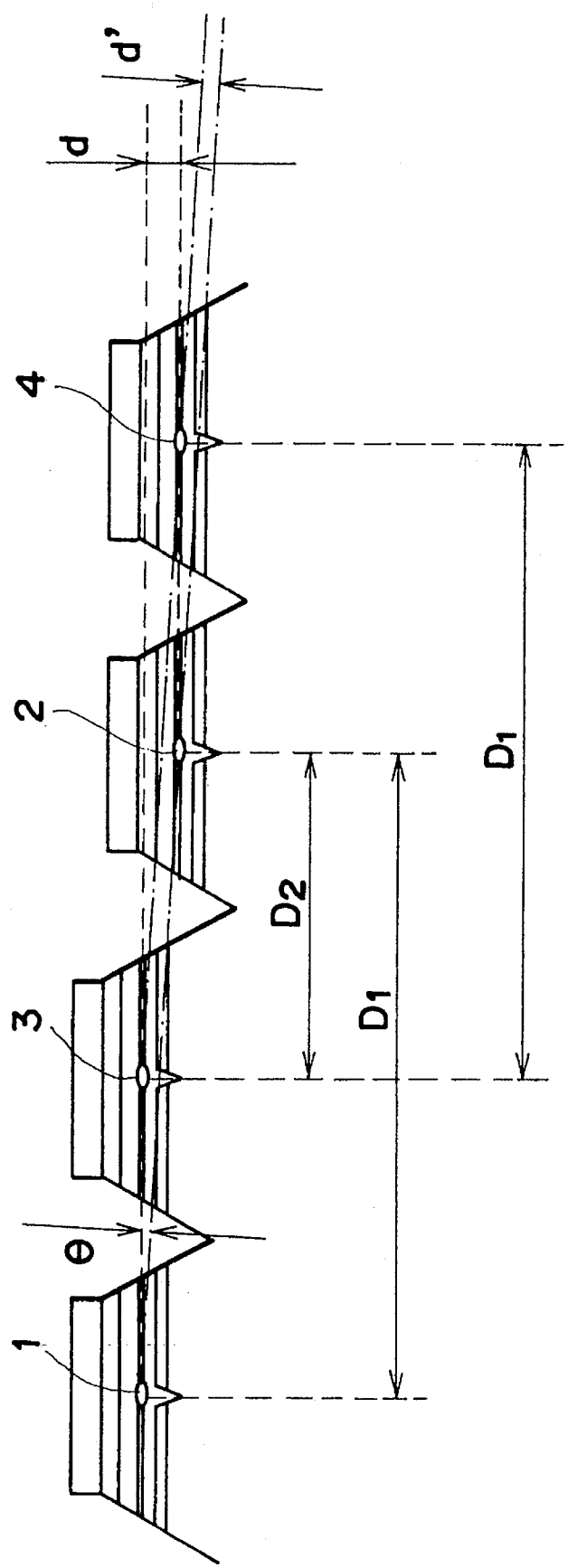
FIG. 14 is a drawing to show an embodiment of a semiconductor laser array.
Figure 15:
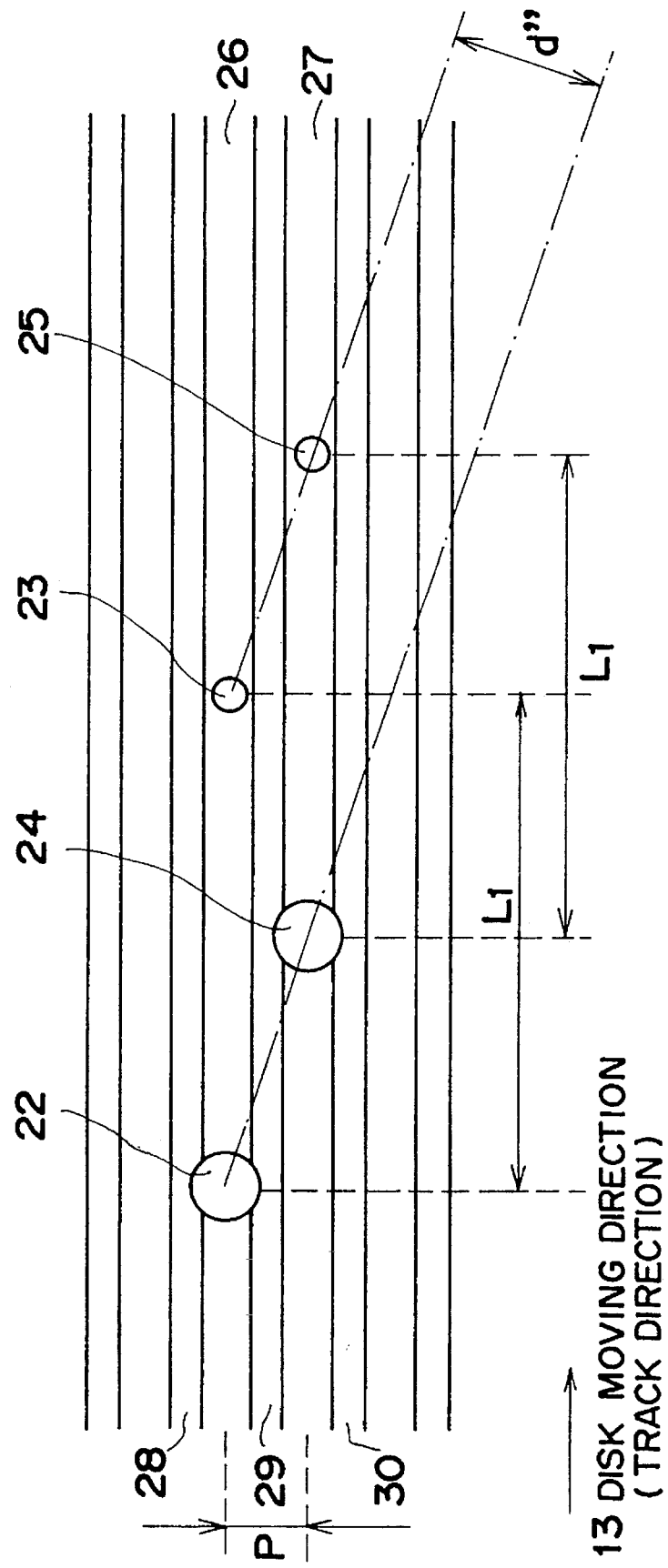
FIG. 15 is a drawing to show an arrangement of light spots on a magneto-optical disk.

FIG. 14 shows the structure of another semiconductor laser array which is the light source portion in the magneto-optical disk apparatus of the present invention. A semiconductor laser array chip 7 has radiative points 1 to 4, which are denoted by the same numerals as those having the same functions in FIG. 7. The four radiative points are formed for example on an n-type GaAs substrate 5, similarly as in FIG. 6, and have two different heights, between which there is a difference d. The structure of each semiconductor laser chip is the same as that in FIG. 6. The four radiative points 1–4 are arranged for example such that radiative points 1 and 3 are formed at a same height on the substrate while radiative points 2 and 4 are at another same height on the substrate, as shown in FIG. 14. A distance between the radiative points 1 and 2 and a distance between the radiative points 3 and 4 are $D_1$, and a distance between the radiative points 2 and 3 is $D_2$.

The light spots on the magneto-optical disk 11 are described below with reference to FIG. 15, where the semiconductor laser array 7 as shown in FIG. 14 is set in the magneto-optical disk apparatus of FIG. 8. The optical system of FIG. 8 forms images of the radiative points 1 to 4 as fine light spots 22–25 on arbitrary adjacent tracks 26 and 27. The radiative point 1 corresponds to the light spot 22 for overwrite on the track 26 in FIG. 14, the radiative point 2 to the light spot 23 for direct verification on the track 26, the radiative point 3 to the light spot 24 for overwrite on the track 27, and the radiative point 4 to the light spot 25 for direct verification on the track 27. Numerals 28–30 denote guide grooves for tracking, and a pitch between tracks is represented by P. The light spots 22, 23 and the light spots 24, 25 can be positioned on the adjacent tracks, respectively, for example by rotating the semiconductor laser array 7 shown in FIG. 8 by a slight angle Θ with respect to the track direction 13. The beams emitted from the semiconductor laser 7 are polarized in the arrow direction in the plane of FIG. 8. If the polarization beam splitter selected has a property to reflect almost 100% of s-polarized light, the direction of polarization of the beams will be approximately parallel to the track direction 13 on the magneto-optical disk 11.

The two sets of light spots can be positioned on the adjacent tracks by setting values for the optical system as follows. When the collimator lens has a focal length $f_1$ and the objective lens a focal length $f_2$, a lateral magnification of the optical system is $f_2/f_1$. Thus, a radial distance between the light spots is approximately given by the following equation.

$$d'(f_2/f_1)=\{(D_1-D_2)/D_1\}d(f_2/f_1)=P \quad (6)$$

Accordingly, if the pitch P between tracks is preliminarily determined, the difference d is obtained as follows.

$$d=\{D_1/(D_1-D_2)\}(f_1/f_2)P \quad (6')$$

The difference d=8 μm for example if P=1.5 μm, $f_1$=8 mm, $f_2$=3 mm, $D_1$=160 μm and $D_2$=80 μm. The rotation angle e is about 2.9°. A distance d" in FIG. 15 corresponds to the difference d' in FIG. 14 imaged on the magneto-optical disk 11 through the optical system shown in FIG. 8 [i.e., d"=($f_2$/$f_1$)d'=P]. The distance between the spots in the track direction can be obtained by Equations (3) and (4). $L_1$=60 μm and $L_2$=30 μm for example if $D_1$=160 m, D=80 μm, $f_1$=8 mm and $f_2$=3 mm.

The light spots 22–25 function on the magneto-optical disk 11 in the same manner as in the first embodiment.

Figure 16:
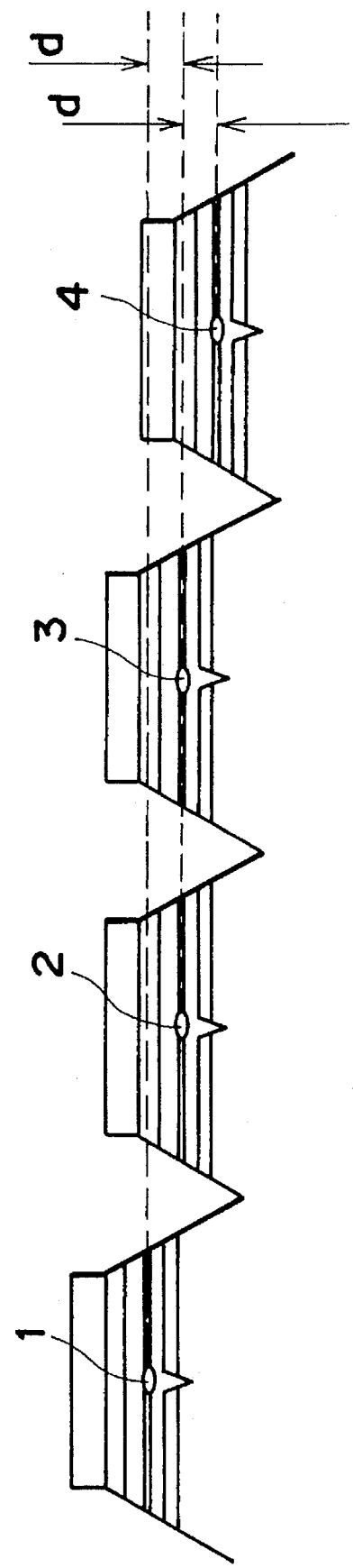
FIG. 16 is a drawing to shown an embodiment of a semiconductor laser array.

Further, the fifth embodiment of the optical recording/reproducing apparatus of the present invention is next described referring to FIG. 16.

FIG. 16 shows the structure of another semiconductor laser array which is the light source portion in the magneto-optical disk of the present invention. A semiconductor laser array chip 7 has four radiative points 1 to 4 for example. The four radiative points are formed for example on a common n-type GaAs substrate 5, similarly as in FIG. 6, and the substrate has three different heights. The four radiative points 1–4 are so arranged for example such that radiative points 2 and 3 are formed at a same height on the substrate and that a relative level difference is d between the radiative points 1 and 2 or between the radiative points 3 and 4.

The optical system shown in FIG. 8 forms images of four fine light spots 22–25 on arbitrary adjacent tracks 26, 27. In a case that the radiative points 1 and 3 correspond to light spots for overwrite and the radiative points 2 and 4 to light spots for direct verification, the laser array can be used in the same manner as in the embodiment shown in FIG. 7. If the radiative points 1 and 2 correspond to light spots for overwrite and the radiative points 3 and 4 to light spots for direct verification, the laser array can be used in the same manner as in the embodiment shown in FIG. 14. These arrangements of the light source are properly selected depending upon the properties such as the optical system used (e.g. the focal length of the collimator lens or the focal length of the objective lens), the track pitch of the magneto-optical disk, and the distance necessary on the magneto-optical disk between the overwrite light spots and the direct verification light spots.

Also, the relative level differences between the radiative points may be made unequal to each other, or the radiative points may be arranged at mutually different heights on the substrate. Although the light spots are located on the adjacent tracks on the magneto-optical disk in the above embodiment, the light spots may be positioned on a track and on another track next to the adjacent track immediately thereto, or another arrangement may be considered. Although the semiconductor laser array 7 including the radiative points of the present invention is produced on a common substrate, radiative points produced on different substrates may be combined in position. The present invention also can be applied to semiconductor laser arrays having more than four radiative points.

Next described with reference to FIG. 8 is a detection method of an RF signal (magneto-optical signal) and servo signals for AT and AF controls, suitable for the magneto-optical disk apparatus of the present invention. Reflected light from the four light spots 22–25, which are formed on the magnetic layer 12 of the magneto-optical disk 11, is collimated through the objective lens 11. Beams reflected by the polarization beam splitter 9 are guided to the RF signal and servo signal detection system. If the polarization beam splitter 9 has such a polarization characteristic that p-polarized light reflectivity $R_s$=10–30% and s-polarized light reflectivity $R_s$=100%, the Kerr rotation angle is amplified so as to permit detection excellent in S/N ratio. The beams pass through the half-wave plate 14 with the optical axis thereof being rotated by 22.5° to the p-polarization component, so that the polarization direction of the beams is rotated by 45°. After the rotation, the beams are guided to pass through the condenser lens 15, the cylindrical lens 16, and the polarization beam splitter 17, whereby each beam is split into two beams and the split beams are guided to respectively corresponding photodetectors 18, 19. The cylindrical lens 16 is inserted for autofocus (AF) in the astigmatic method such that the generatrix thereof is rotated by 45° with respect to the track direction.

Figure 17:
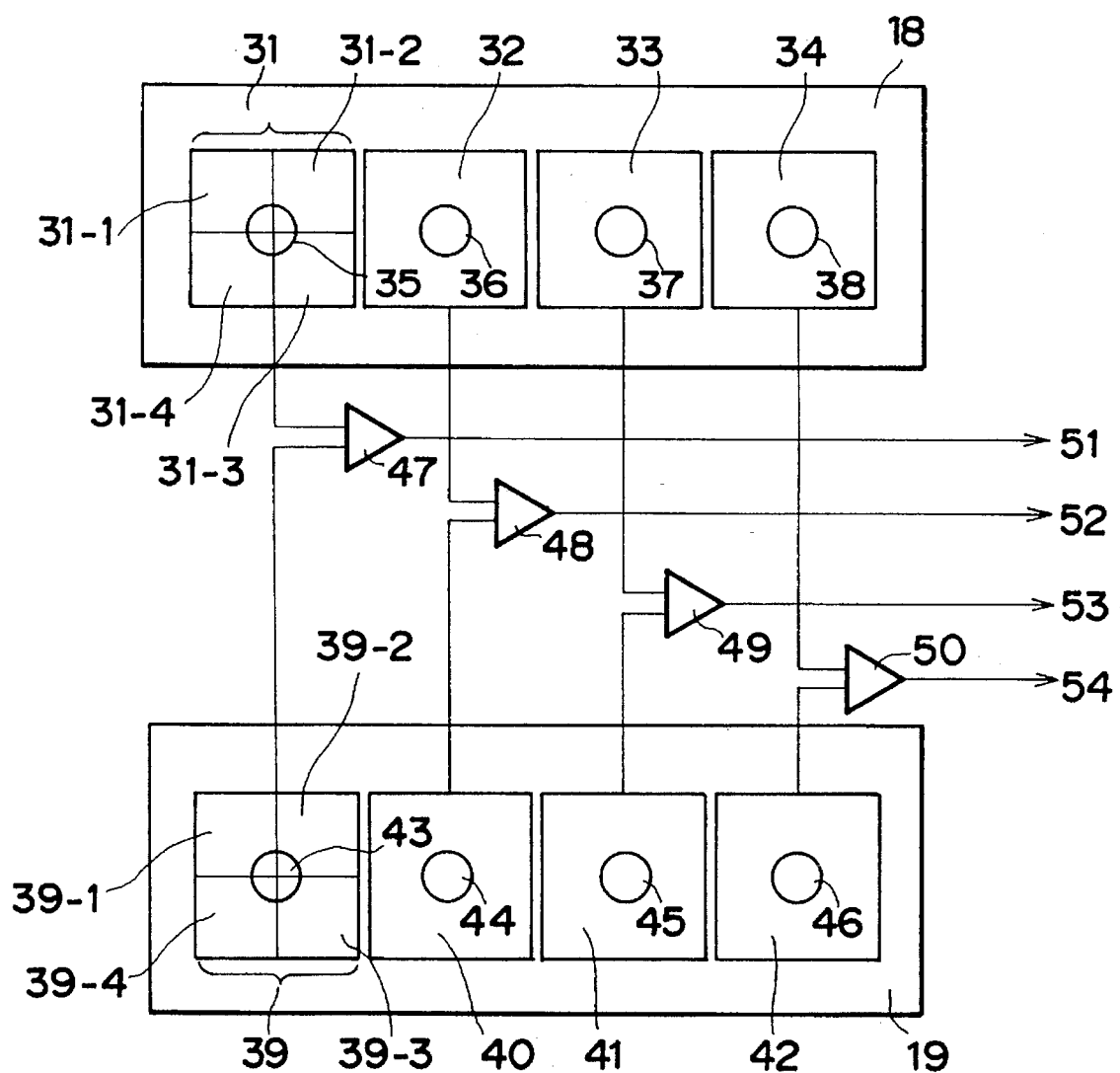
FIG. 17 is a drawing to show an RF-servo signal detection system suitable for a magneto-optical disk apparatus of the present invention.

Next described with reference to FIG. 17 is the detection method of an RF signal and a servo signal using the photodetectors 18, 19 with the light source of the embodiment in FIG. 7.

The photodetector 18 includes four light receiving regions 31–34, and the light receiving region 31 is sectioned into four segments 31-1 to 31-4. Imaged on the light receiving regions are light spots 35–38 respectively corresponding to the light spots 22–25 on the magneto-optical disk 11. If the condenser lens 15 has a focal length $f_3$ of 30 mm, intervals between the lights spots are about 300 μm. Similarly, the photodetector 19 has four light receiving regions 39–42, and the light receiving region 39 is a quarter-sectioned sensor. Imaged on the light receiving regions are light spots 43–46 respectively corresponding to the light spots 22–25. The light spots on the photodetectors as shown are those close to the least circle of confusion of the cylindrical lens 16, which are correctly AF-controlled.

In the embodiment in FIG. 17 the servo signal detection is performed with the light spot 22 on the magneto-optical disk 11, that is, with the light spots 35 and 43 on the photodetectors. A focus error signal (AF signal) is a difference signal between two diagonal sums from a quarter-sectioned sensor. An AF signal $AF_1$ from quarter-sectioned sensor 31 may be expressed by the following equation using annex numerals to the sensor segments.

$$AF_1=(1+3)-(2+4) \quad (7)$$

Also, if an AF signal $AF_2$ is obtained using an output from sensor 39, the signal may be expressed by the following equation using annex numerals to the sensor segments (each annex numeral is given " ' " for discrimination from above Equation (7) ).

$$AF_2=(1'+3')-(2'+4') \quad (8)$$

An AF signal AF may be produced as follows using the two outputs in Equations (7) and (8).

$$AF=AF_1+AF_2 \quad (9)$$

Using the AF signal obtained by Equation (9) can effectively prevent focus offset caused by the birefringence in the magneto-optical disk 11.

The autotracking (AT) signal is a difference signal from the sensor divided by a dividing line extending in parallel with the direction corresponding to the track direction (push-pull method). An AT signal $AT_1$ from the quarter-sectioned sensor 31 may be expressed by the following equation using annex numerals to the sensor segments.

$$AT_1=(2+3)-(1+4) \quad (10)$$

Similarly as in the cases for an AF signal, the output from the sensor 39 may be used as an AT signal or the two sensor outputs from the sensors 31 and 39 may be used therefor. Japanese Patent Application No. 3-325106 describes in detail the method for stable tracking servo on a plurality of light spots using an AT signal from a single light spot.

The following two methods are considered for detection of an RF signal.

First in overwrite, while information writing is carried out using the light spots 22 and 24 on the magneto-optical disk 11, the information immediately after being recorded is reproduced using the light spots 23 and 25 (corresponding to light spots 36, 44 and 38, 46 on the photodetectors). In this case, information from light spot 23 and information from light spot 25 are obtained as magneto-optical signals 52 and 54, respectively, after differential amplification by differential amplifier 48 between outputs of photodetectors 32 and 40 and after differential amplification by differential amplifier 50 between the outputs of photodetectors 34 and 42. In ordinary reproduction, the light spots 23 and 25 are used for reproduction under servo with light spot 22 on the magneto-optical disk. The light spot 24 may be turned off during the reproduction. As so arranged, the light spots 22, 24 can be used only for overwrite (though the light spot 22 is also used for servo signal detection), and therefore the laser noise reducing means (such as a high-frequency overlay circuit) is required only by the light spots 23 and 25. Also, since the servo and the RF are independent of each other, there is no need to obtain a weak magneto-optical signal from a sectioned sensor such as the sensors 31 and 39, which is advantageous with respect to thermal noise of pre-amp. (The thermal noise would be doubled if a separate pre-amp was provided for a quarter-sectioned sensor to detect a magneto-optical disk therethrough.) Preliminarily formatted information such as address information on the information tracks of magneto-optical disk 11 may be read using the light spots 22, 24 independently of the magneto-optical signal.

In another detection method, the overwrite is carried out in the same manner as above, and in ordinary reproduction the reproduction of a magneto-optical signal may be carried out simultaneously with the servo using light spot 22. Either one of the light spots 24, 25 on the track 27 can be used for reproduction. In this example, the information from light spot 22 is obtained as a magneto-optical signal 51 after differential amplification by a differential amplifier 47 between a sum signal output from the quarter-sectioned sensor of photodetector 31 and a sum signal output from the quarter-sectioned sensor of photodetector 39, while information from the light spot 24 (25) is obtained as a magneto-optical signal 53 (54) after differential amplification by a differential amplifier 49 (50) between outputs from the photodetectors 33 and 41 (34 and 42). This method is disadvantageous with respect to necessity of extra noise reducing means or with respect to thermal noise, but advantageous with respect to less influence of focus error or tracking error caused in an information-reproducing light spot. In particular, this method is effective if an amount of reading information is small enough to necessitate no parallel reproduction (e.g., if only the light spot 22 is used for reproduction).

Either one of the two detection methods as described may be arbitrarily used, or both the methods can be employed for selective use with necessity. If an amount of writing information is small, only a set (e.g., light spots 22, 23) may be used out of the two sets.

Figure 18:
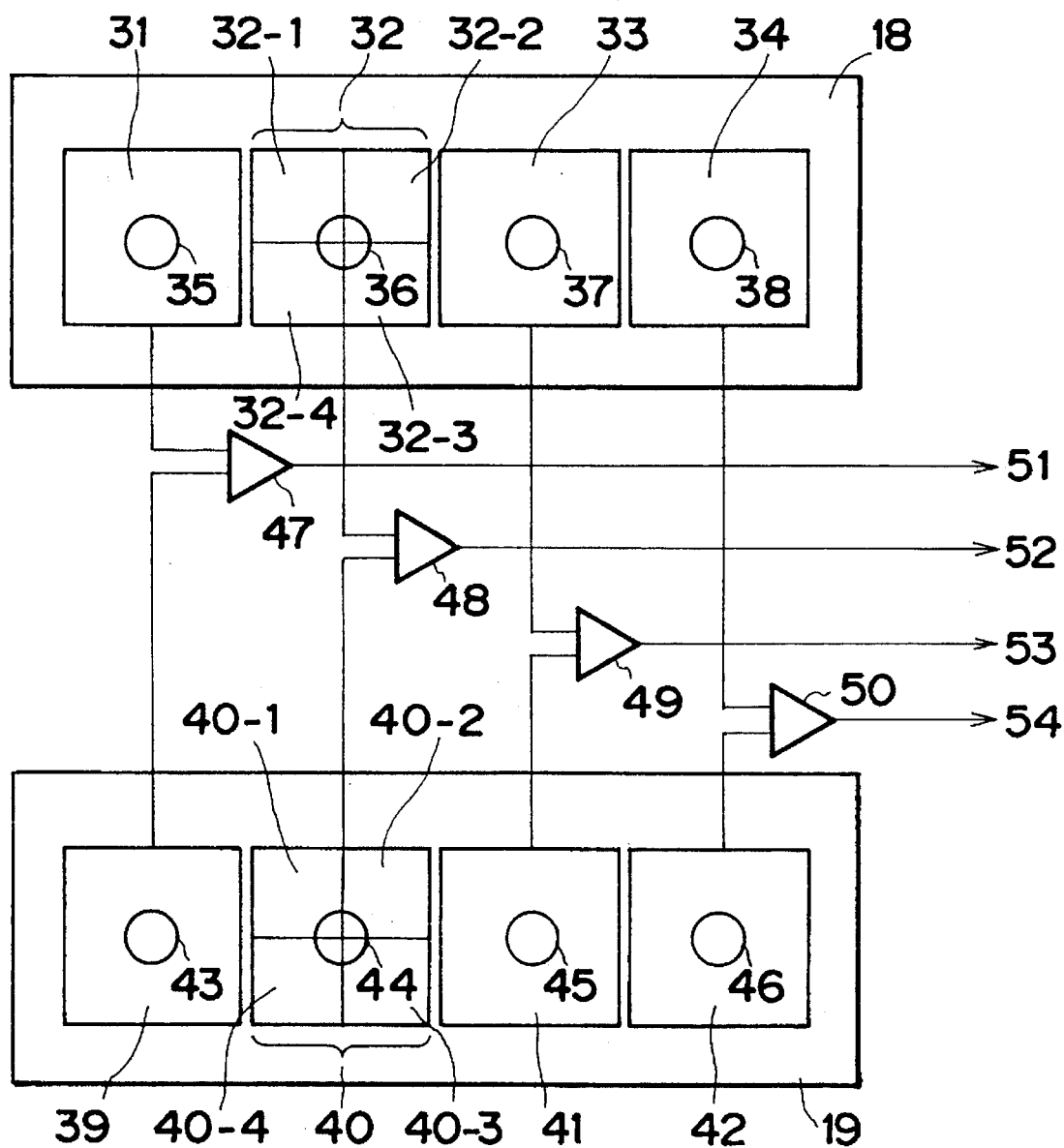
FIG. 18 is a drawing to show an RF-servo signal detection system suitable for a magneto-optical disk apparatus of the present invention.

FIG. 18 shows another embodiment. Portions with the same functions are denoted by the same numerals as those in FIG. 17. In the embodiment in FIG. 18 the servo signal detection is performed using the light spot 23 on the magneto-optical disk 11, that is, the light spots 36 and 44 on the photodetectors. AF and AT signals may be detected in the same manner as in FIG. 17. There are two methods as described below for detection of an RF signal. In overwrite, the function of light spots on the magneto-optical disk 11 and the information reproduction method are the same as those in the embodiment of FIG. 17. However, the servo signal detection is carried out using the light spot 23 for direct verification. In ordinary reproduction, information is reproduced using the light spots 23 and 25 under the servo using the light spot 23. The light spots 22 and 24 may be turned off during the reproduction, or they may be used for reading preformatted address information. As so arranged, the light spots 23 and 25 are continuously driven always at a constant low power $P_3$ as described above, and then no change is necessary for gain of a servo system even in a change of operation between overwrite and ordinary reproduction, whereby the arrangement may be made simpler. Also, only the light spots 23 and 25 need the noise reducing means. However, this method is disadvantageous with respect to thermal noise of pre-amp, because the light spots are used in common for servo signal detection and for RF signal detection, as discussed above. In another detection method, the overwrite is carried out in the same manner as above, but in ordinary reproduction the magneto-optical signal is reproduced using the light spot 22 under servo with the light spot 23. Either one of the light spots 24, 25 on the track 27 may be used for reproduction. This arrangement is advantageous with respect to thermal noise of pre-amp, as discussed above.

Figure 19:
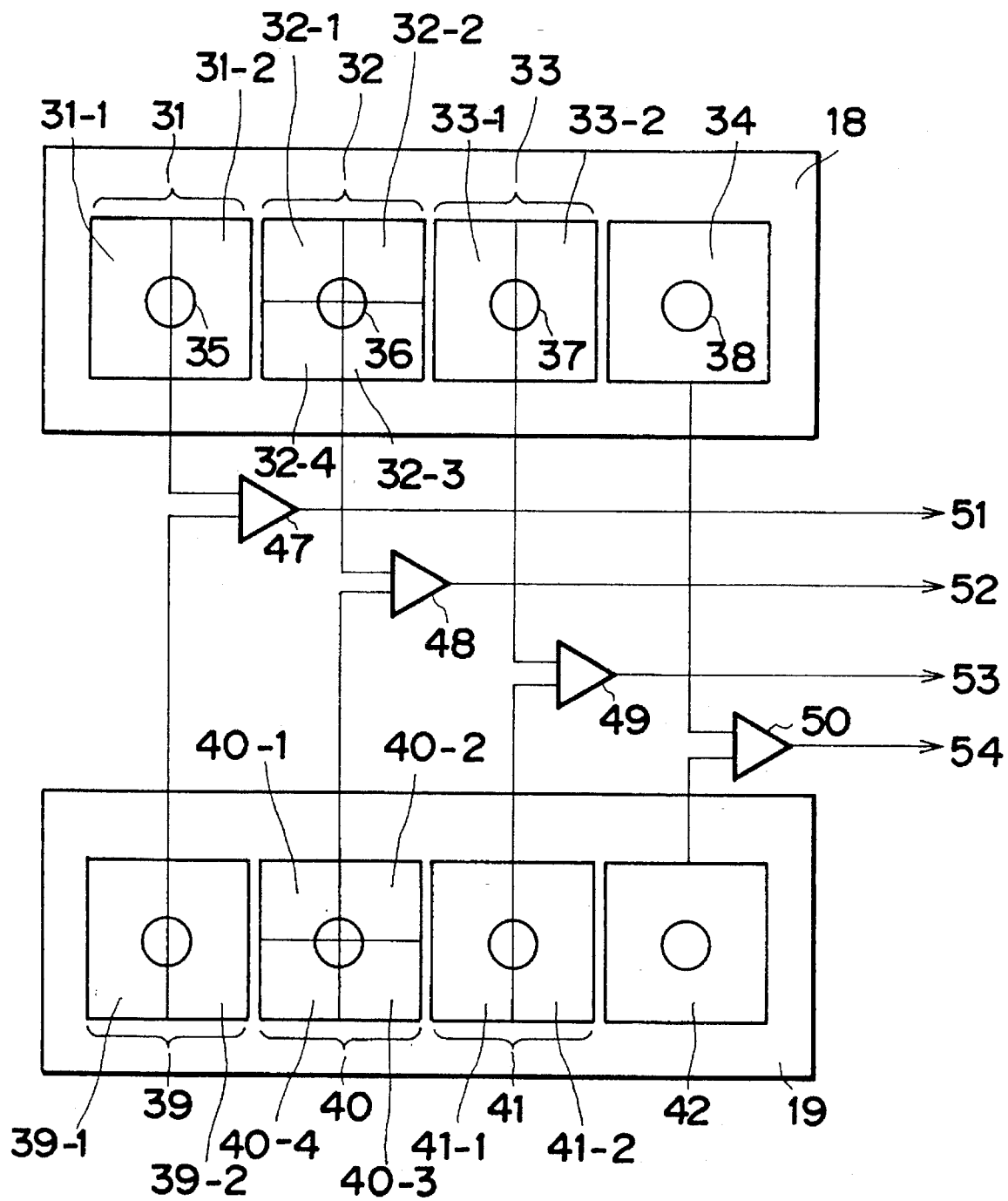
FIG. 19 is a drawing to show an RF-servo signal detection system suitable for a magneto-optical disk apparatus of the present invention.

FIG. 19 shows still another embodiment. Portions with the same functions are denoted by the same numerals as those in FIG. 17. In FIG. 19, the functions of AF and AT are separated from each other and an AT signal is obtained from the light spots 22, 24 on the two tracks 26, 27. An AF signal may be obtained from the light spot 23 on the magneto-optical disk 11 in the same manner as in the embodiment of FIG. 18. Photodetectors 32 and 40 are formed as quarter-sectioned sensors. If only an AF signal is obtained from the photodetectors, a pre-amp may be assigned to a signal of diagonal sum. Then, the thermal noise of pre-amp becomes 2 times that in the case of no division, which is advantageous as compared with the embodiments in FIG. 17 and in FIG. 18.

An AT signal $AT_1$ may be expressed by the following equation using annex numerals to the sensor segments in half-sectioned sensor 31 of the photodetector 18.

$$AT_1 = 1 - 2 \quad (11)$$

Also, an AT signal $AT_2$ may be similarly expressed by the following equation in half-sectioned sensor 33 (in which annex numerals are given " ' " for discrimination from above Equation (11)).

$$AT_2 = 1' - 2' \quad (12)$$

An AT signal AT may be produced as follows using both outputs in Equations (11) and (12).

$$AT = AT_1 + AT_2 \quad (13)$$

In the arrangement using equation (13), an average of track deviations of the light spots 22 and 24 on the magneto-optical disk 11 can be used as an error signal, which enables high-precision AT servo. Also, using both outputs from the half-sectioned sensors 39, 41 on the photodetector 19 can effectively prevent tracking offset caused by birefringence in the magneto-optical disk 11. Although the overwrite light spot is assigned to the AT signal detection and the direct verification light spot to the AF signal detection in FIG. 19, they may be interchanged with each other.

Figure 20:
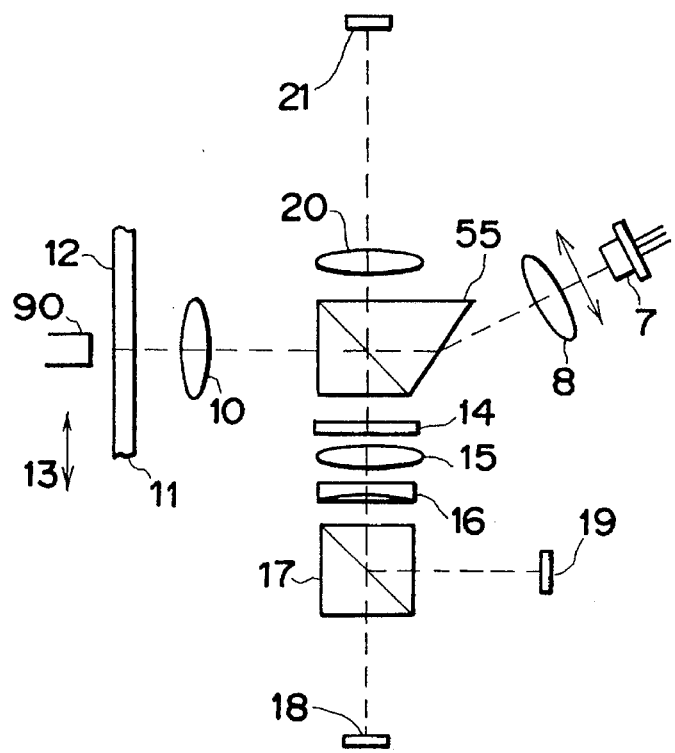
FIG. 20 is a drawing to show an optical system in a magneto-optical disk apparatus of the present invention.

Next described with reference to FIG. 20 is an optical system suitable for the magneto-optical disk apparatus of the present invention. Portions with the same functions are denoted by the same numerals as those in FIG. 8. In FIG. 20, a polarization beam splitter 55 having a beam shaping function is used in place of the polarization beam splitter 9 in FIG. 8. The beam shaping is effected in the direction in which the radiation angle of semiconductor laser array 7 is smaller, that is, in the track direction 13 in FIG. 20.

In this case, a distance between the light spots in the track direction is an inverse of a beam shaping ratio. Equations (3) and (4) will be modified as follows if the semiconductor laser array in the embodiment of FIG. 7 is used as a light source and if the beam shaping ratio is α.

$$L_1' = (f_2/\alpha f_1)D_1 \quad (3')$$

$$L_2' = (f_2/\alpha f_2)D_2 \quad (4')$$

$L_1' = L_2' = 15$ μm for example if $D_1 = D_2 = 80$ μm, $f_1 = 8$ mm, $f_2 = 3$ mm and α=2. Accordingly, the embodiment of FIG. 8 require a field angle of approximately 1° for objective lens 10, while the embodiment of FIG. 20 requires a field angle of 30' or less. Therefore, the embodiment of FIG. 20 is very advantageous with respect to imaging quality of light spots. However, the distances between the four light spots on the photodetectors 18, 19 are about 150 μm, which is a half of those in the embodiment of FIG. 8. Thus, the separation of beams will be somewhat difficult.

Figure 21:
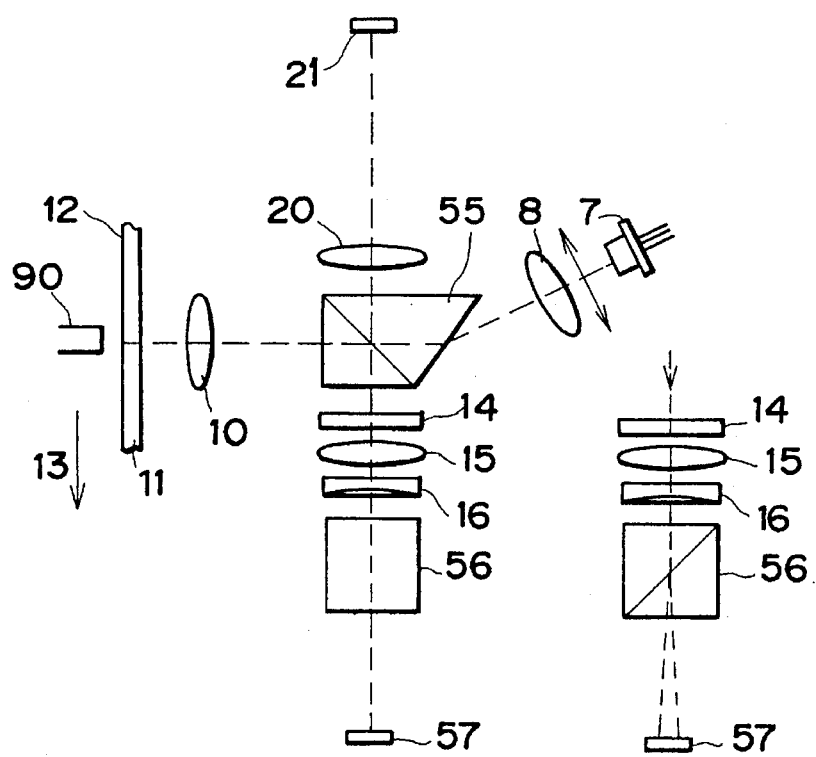
FIG. 21 is a drawing to show an optical system in a magneto-optical disk apparatus of the present invention.
Figure 22:
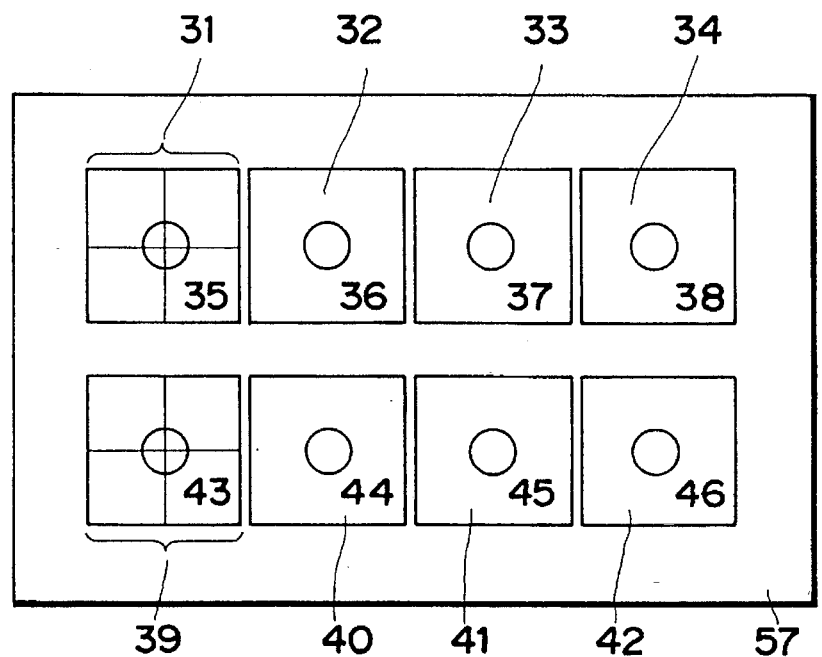
FIG. 22 is a drawing to show a photodetector in FIG. 21.

Further described with reference to FIG. 21 and FIG. 22 is an optical system suitable for the magneto-optical disk of the present invention. Portions with the same functions are denoted by the same numerals as those in FIG. 20. In FIG. 21, a Wollaston prism 56 is used in place of the polarization beam splitter 17 in FIG. 20. A side view of the optical system is shown on the right side in FIG. 21. The Wollaston prism separates a beam into two perpendicular polarization components. An angle of separation is about 1°. Thus, if the direction for beam separation was not selected in the direction perpendicular to the track direction 13 as shown in FIG. 21, the light spots 35–38 would overlap with the light spots 43–46 on the photodetector 57. FIG. 22 shows the detailed arrangement of the photodetector 57. Since the photodetector portions 31–34 and 39–49 can be formed on a common substrate, positioning is easy between the light spots and the sensors. The detection methods of RF signal and servo signal in FIG. 22 are the same as those in the embodiment of FIG. 17.

Figure 23:
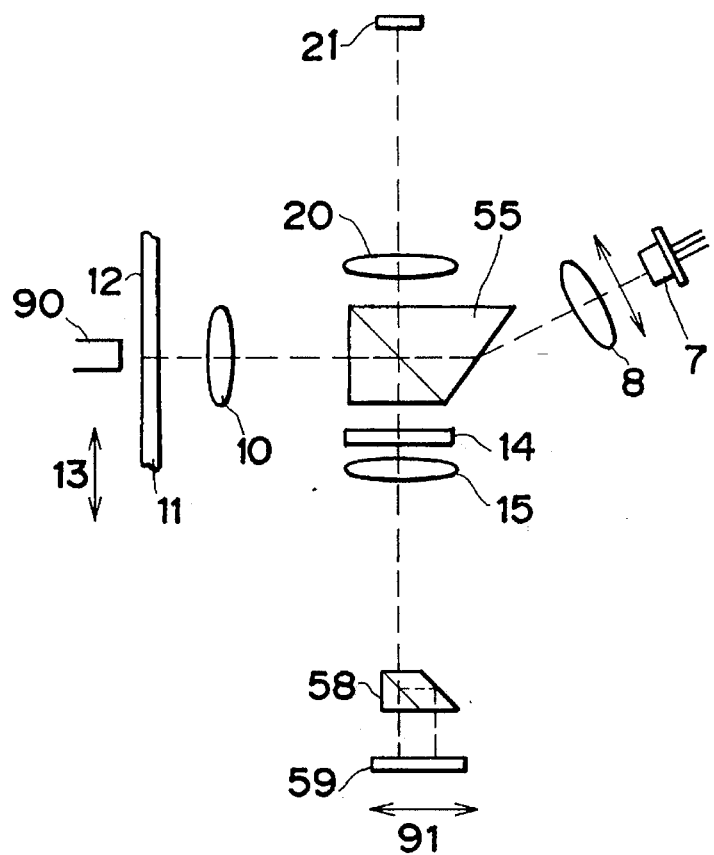
FIG. 23 is a drawing to show an optical system in a magneto-optical disk apparatus of the present invention.
Figure 24:
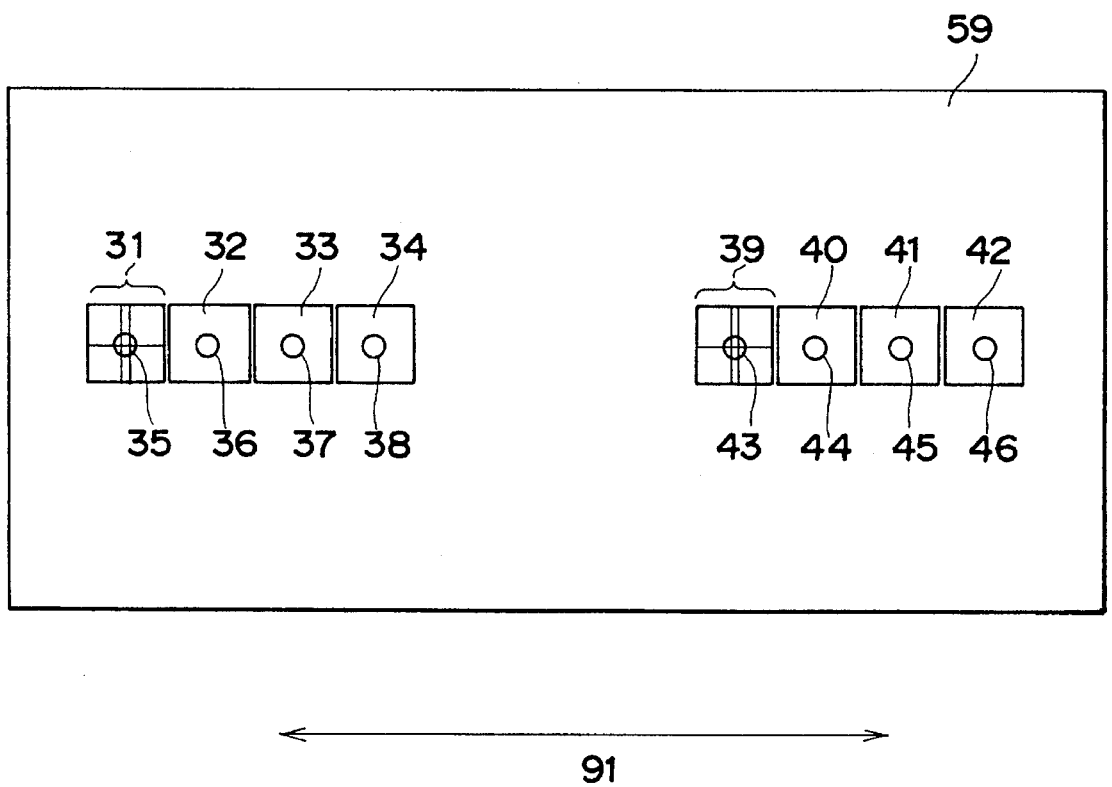
FIG. 24 is a drawing to show a photodetector in FIG. 23.

Further described with reference to FIG. 23 to FIG. 26 is an optical system suitable for the magneto-optical disk apparatus of the present invention. Portions with the same functions are denoted by the same numerals as those in FIG. 21. In FIG. 23, a micro polarization beam splitter 58 is used in place of the polarization beam splitter 17. The micro polarization beam splitter 58 has the same polarization property as the polarization beam splitter 17, but guides two beams of perpendicular polarization components onto a photodetector 59 in parallel with each other. Although the polarization beam splitter 58 in FIG. 23 splits beams into light spots 35–38 and light spots 43–46 as shown in FIG. 24 in the direction of arrows 91, the beams may be split in the direction perpendicular to the arrows 91. Also, omitting the half-wave plate 14, the micro polarization beam splitter 58 may be rotated by 45° about the optical axis thereof. In FIG. 24, photodetectors 31–34 and 39–42 may be formed on a common substrate to form a photodetector 59, similarly as in FIG. 22. The photodetector 59 is positioned before the focal point of condenser lens 15 for beams transmitted by the micro polarization beam splitter 58 and after the focal point of condenser lens 15 for beams reflected by the micro polarization beam splitter 58, while keeping an equal distance to both focal points.

Figure 25A:
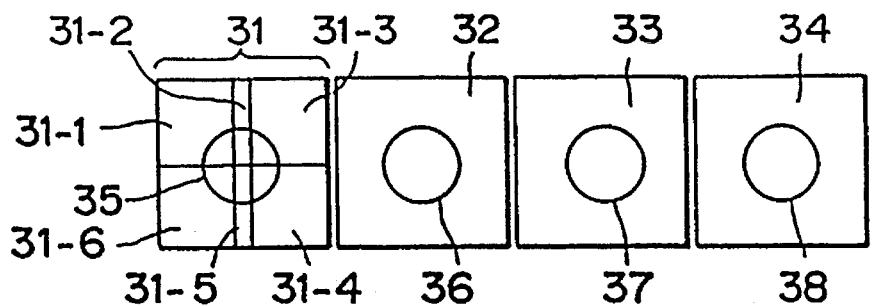
FIGS. 25(a) and 25(b) are drawings to illustrate a servo signal detection method.
Figure 25B:
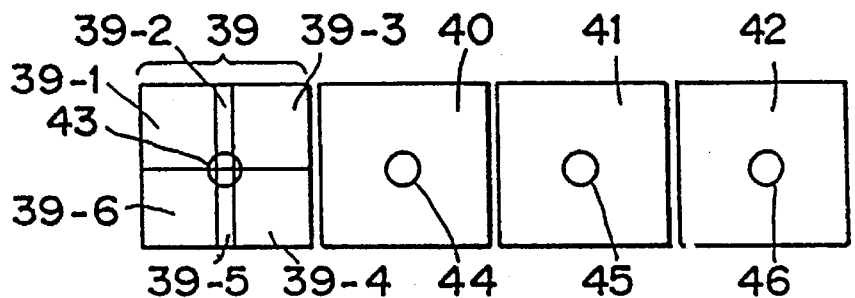

The detection method of a servo signal is briefly described referring to FIG. 25(a) and FIG. 25(b). These figures show the photodetectors 31–34 and 39–42 on the photodetector 59 in FIG. 25(a) and FIG. 25(b), respectively. These figures show an example of a light spot shape seen when the magneto-optical disk 11 is located closer to the objective lens 10.

The detection of an AF signal is carried out by the beam size method, for example using a difference signal from a six-sectioned sensor between inner sensor segments and outer sensor segments. An AF signal $AF_1$ in sensor 31 may be expressed by the following equation using annex numerals to the sensor segments.

$$AF_1=(2+5)-(1+3+4+6) \tag{14}$$

Also, in a case that an AF signal $AF_2$ is obtained using outputs from sensor 39, the signal may be expressed by the following equation using annex numerals to the sensor segments (in which the annex numerals are given " ' " for discrimination from above Equation (14)).

$$AF_2=(2'+5')-(1'+3'+4'+6') \tag{15}$$

The light spots 35-38 and the light spots 43-46 are located on either side of a focal point position of the condenser lens 15, and therefore an AF signal AF may be produced using a differential output between the two signals obtained by Equations (14) and (15).

$$AF=AF_1-AF_2 \tag{16}$$

Using the signal from Equation (16) can effectively prevent leakage of an AT signal due to the guide grooves for tracking on the magneto-optical disk.

An AT signal may be a difference signal between sensor segments divided by a dividing line extending in the track direction (the push-pull method). An AT signal $AT_1$ in sensor 31 may be expressed by the following equation using the annex numerals to the sensor segments.

$$AT_1=(1+2+3)-(4+5+6) \tag{17}$$

Also, in a case that an AT signal $AT_2$ is obtained using outputs from the sensor 39, the signal may be expressed by the following equation using the annex numerals to the sensor segments (in which the annex numerals are given " ' " for discrimination from above Equation (17)).

$$AT_2=(1'+2'+3')-(4'+5'+6') \tag{18}$$

An AT signal AT may be produced using a differential output between the two signals obtained by Equations (17) and (18), similarly as the AF signal.

$$AT=AT_1-AT_2 \tag{19}$$

Using the signal from Equation (19) can suppress the AT offset even if the beams entering the micro polarizing prism 58 are slightly shifted in the tracking direction.

The detection method of an RF signal is the same as in the embodiment of FIG. 17.

Figure 26A:
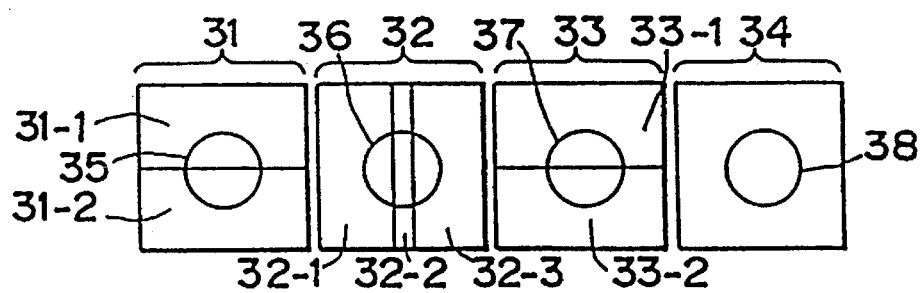
FIGS. 26(a) and 26(b) are drawings to illustrate a servo signal detection method.
Figure 26B:
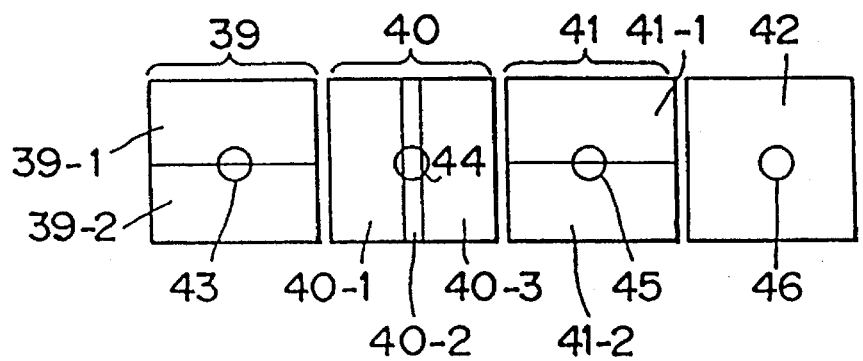

FIG. 26 shows another embodiment different from that in FIG. 25. This embodiment is an example in which the AF and AT functions are separate as in FIG. 19 and in which an AT signal is obtained from light spots 22, 24 on two tracks 26, 27. Since the number of segments per photodetector is decreased, the pre-amp noise is reduced. This adds an advantage of enabling high-precision AT to the embodiment in FIG. 25.

Figure 27:
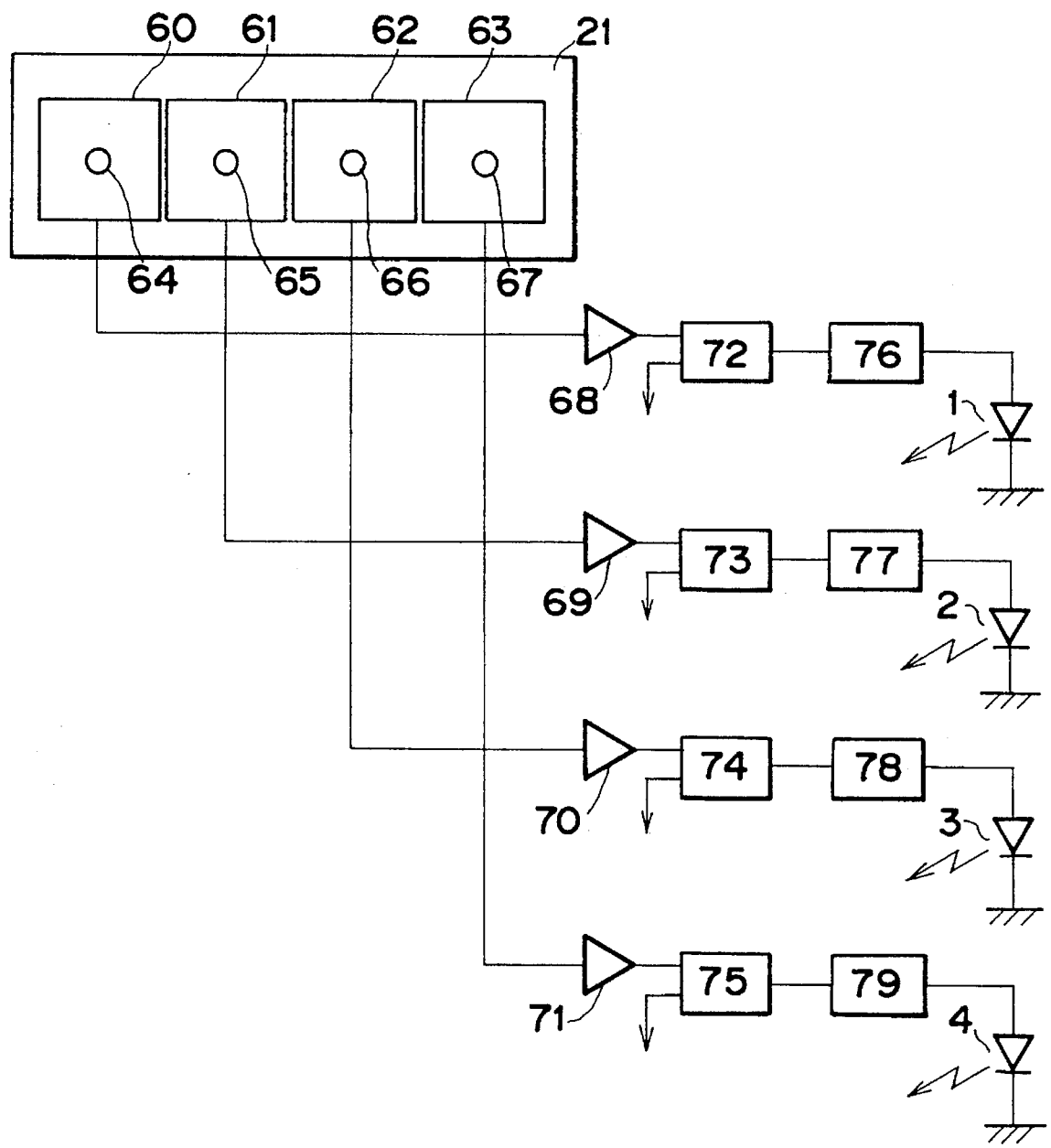
FIG. 27 is a drawing to show a light quantity control system in a semiconductor laser array of the present invention.

Next described with reference to FIG. 27 is a light quantity control method (APC) of a semiconductor laser array 7 suitable as a light source in the magneto-optical disk apparatus of the present invention. FIG. 27 is an explanatory drawing to show the detailed structure of APC photodetector 21 with a light quantity control circuit in the optical system of FIG. 8.

In the optical system of FIG. 8, beams emitted from the semiconductor laser array 7 are partially reflected by the polarization beam splitter 9 to be focused on the photodetector 21 by APC condenser lens 20. In FIG. 27, beams from the radiative points 1-4 correspond to light spots 64-67 on the photodetector 21.

The photodetector 21 is composed of four separate sensors 60-63, onto which the light spots 64-67 respectively impinge. The size of sensors, the diameter of light spots, and the focal length of the condenser lens are so selected as to avoid the interference in light quantity control loop of each light spot. Numerals 68-71 denote amplifiers for outputs of respective sensors, 72-75 comparators for setting target values of light quantity for the respective radiative points 1-4, and 76-79 drivers for driving the respective radiative points 1-4. Each laser driver drives a laser to equalize an output of each sensor to the set the value of a comparator.

The restriction of the above optical system forces the light spots 64-67 to be focused in a near in-focus state on the photodetector 21. Inclining the photodetector 21 by a certain amount may prevent reflected light going from the sensor surface back to the laser, from fluctuating the light quantity (from causing noises).

Figure 28:
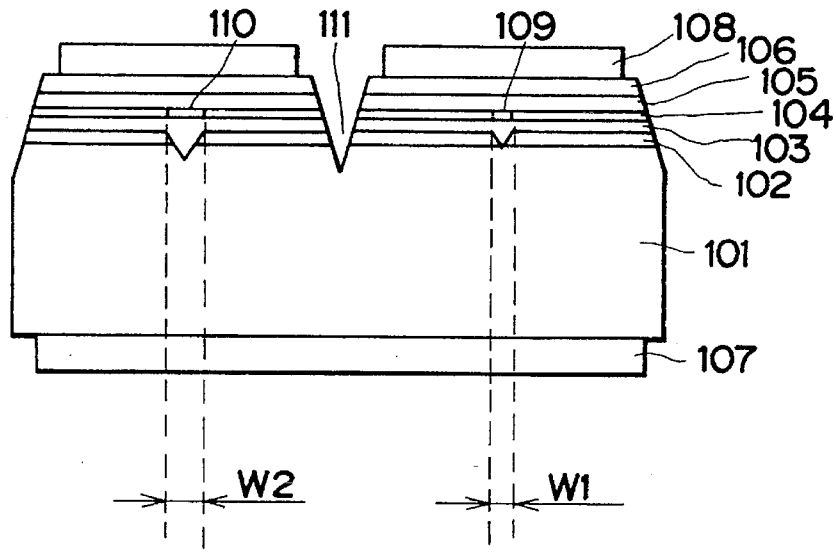
FIG. 28 is a drawing to show an embodiment of a semiconductor laser array of the present invention.

FIG. 28 shows an example of a semiconductor laser array of inner stripe type produced by the liquid phase epitaxy (LPE) method according to the present invention. The present embodiment is arranged to prevent relative defocus between laser beams focused on a track through a common optical system. In FIG. 28, the same numerals denote the same elements as those in the conventional example.

Next described is the process for forming the semiconductor laser array of the present invention. First crystal growth is one to form a block layer 102 on a flat substrate 101. The block layer 102 is then etched to form grooves for inner stripes at intervals of about 100 µm in different stripe widths (W1<W2) and in groove depth reaching the substrate 101. Second crystal growth is next done to form layers 103-106. Since the first clad layer 103 preferentially fills up the etched grooves, which is the feature of liquid phase epitaxy, the surface thereof is substantially flat over the grooves. Accordingly, crystals grow to form layers substantially parallel to the substrate 101 after the fourth layer, i.e., an active layer 104, a second clad layer 105 and a cap layer 106. The first and second clad layers 103, 105 and the active layer 104 therebetween constitute a double heterojunction to be a laser waveguide. Then, etching is effected over the cap layer to form a separation groove 111 reaching the substrate 101 at the middle position between the radiative portions, whereby the integrated laser waveguides are electrically separated. A cathode electrode 108 is formed on each of the n-type cap layers 106 separated by the separation groove 111, while an anode electrode 107 is formed on the bottom surface of p-type substrate 101.

When a voltage is applied between the electrodes, a current flowing between the electrodes is constricted by the block layer 102, whereby the current is efficiently injected into the limited region of the active layer over grooves to oscillate a laser. A radiative portion is located on the active layer 104 and over a groove formed by etching the block layer 102. Numeral 109 designates a radiative portion corresponding to W1 and 110 a radiative portion corresponding to W2. Since the cathode electrodes 108 on the cap layer 106 are separated by the separation groove 111, an arbitrary laser may be independently driven by turning on and off a corresponding cathode electrode.

The laser characteristic can be controlled by changing the stripe width as in the present invention. Namely, as the stripe width is widened (W2), the active layer region into which the current is injected is also broadened. This enlarges the emission area so as to decrease the light density, whereby a high power output can be provided. As the stripe width is widened, the region tends to be close to a region of a gain waveguide type, which increases the astigmatic difference. However, the astigmatic difference tends to decrease with an increase of output light power, and therefore a wide stripe is suitable for use in recording in a range of high output power. In contrast, as the stripe width is made narrower (W1), the active layer region is also narrowed to increase the light density, which makes the high power operation difficult. However, the astigmatic difference will be small in a range of low power, providing the characteristic suitable as a reproduction light source.

Figure 29:
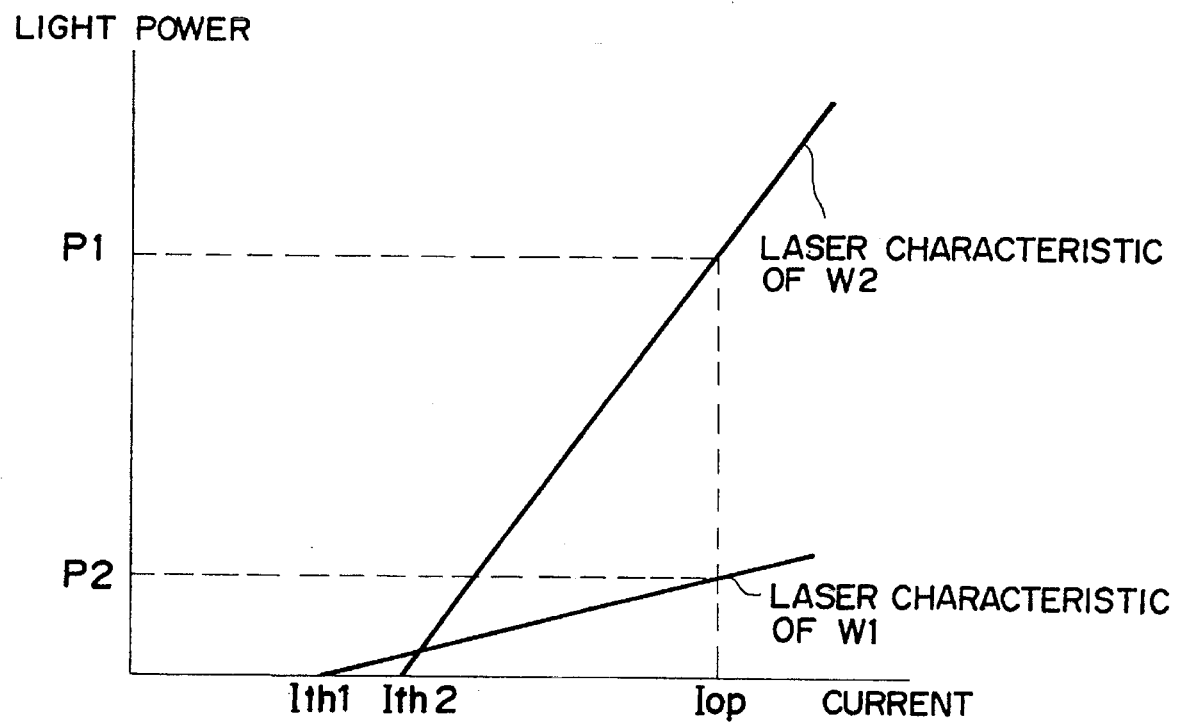
FIG. 29 is a drawing to show a relation between light power and operation current of a semiconductor laser.

Now described with reference to FIG. 29 are oscillation wavelengths of a semiconductor laser array constructed according to the present invention. FIG. 29 shows the relation between light output power and current of the laser. As the stripe width becomes wider (W2), the threshold current Ith2 increases and the emission efficiency has a tendency to increase. In contrast, as the stripe width is made narrower (W1), the threshold current Ith1 decreases and the emission efficiency has a tendency to decrease. Since the oscillation wavelength of the laser is shifted to the longer wavelength side by a temperature rise in the active layer, it may be considered to be approximately proportional to the operation current. In a case that a laser with a wider stripe width is operated at high power (P1) and that a laser with a narrower stripe width at low power (P2), the difference in operation current between the two lasers can be made smaller as compared with lasers having the same stripe width. It is ideally possible to design the lasers to be operated at the same operation current (Iop) as shown in FIG. 29.

As described above, the semiconductor laser array of inner stripe type is so arranged that different stripe widths are employed, one of which provides a beam only for recording and another of which provides a beam only for reproduction, so as to decrease the difference in astigmatic difference and the wavelength difference between the beams, whereby a light source for optical information recording and reproduction may be provided with little relative defocus after the beams have passed through a common optical system.

Figure 1:
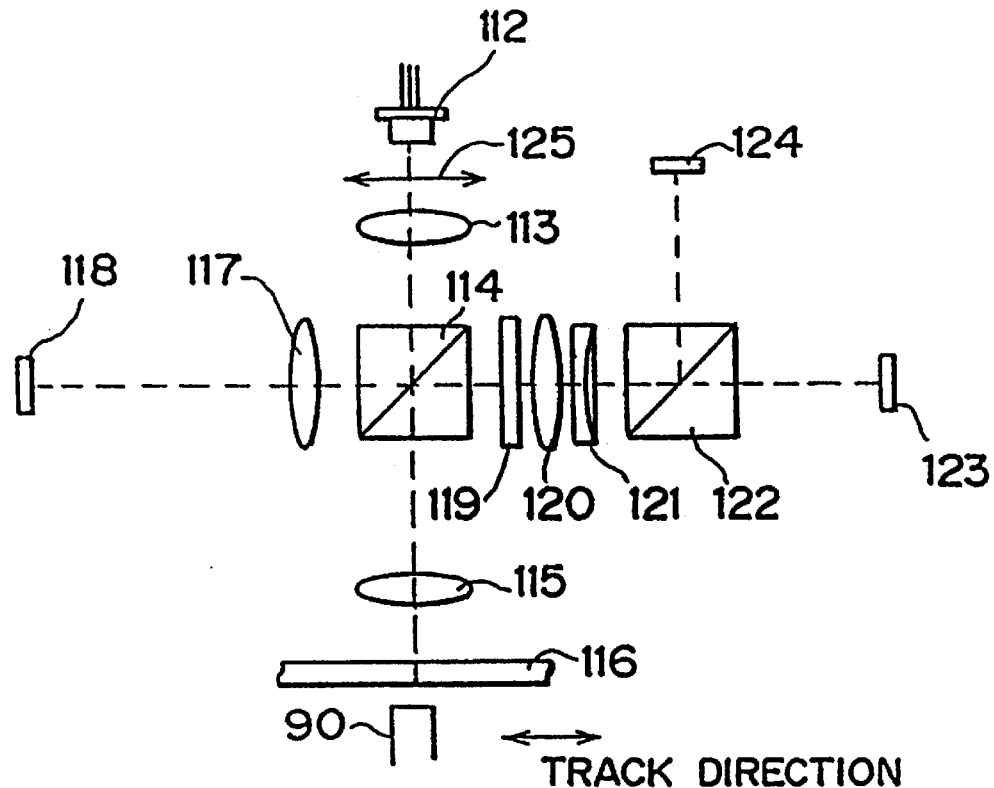
FIG. 1 is a schematic drawing to show an optical system in a conventional optical information recording/reproducing apparatus.
Figure 2:
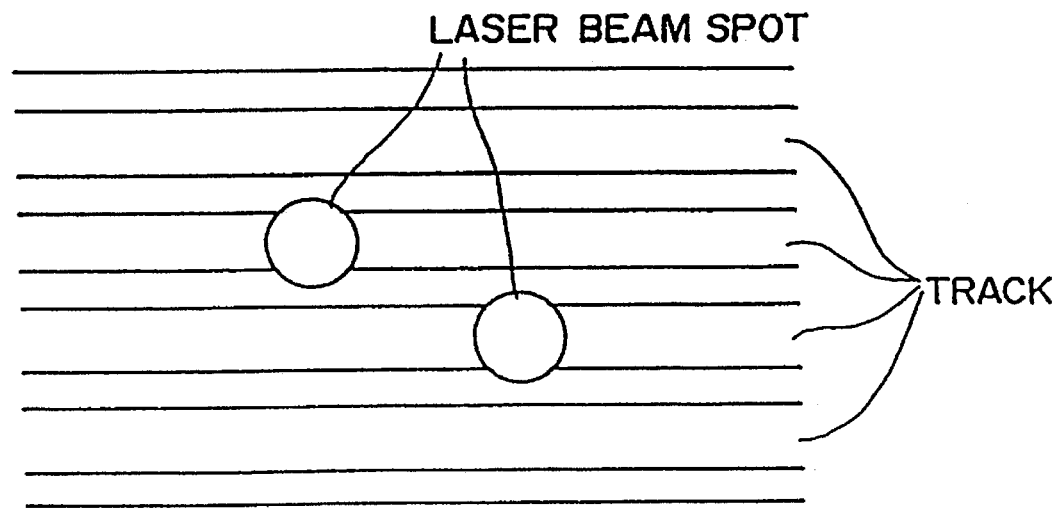
FIG. 2 is a drawing to show a positional relation between laser beams and tracks in a conventional example.
Figure 3:
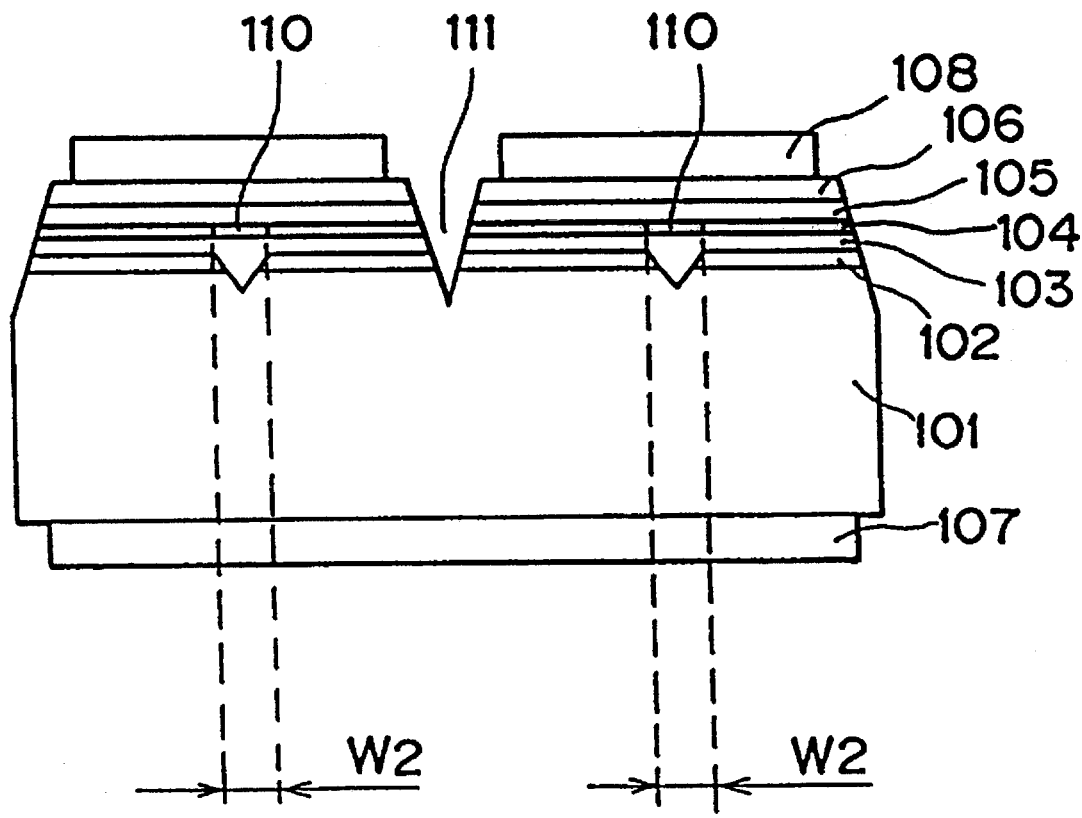
FIG. 3 is a drawing to show a conventional semiconductor laser array.
Figure 4:
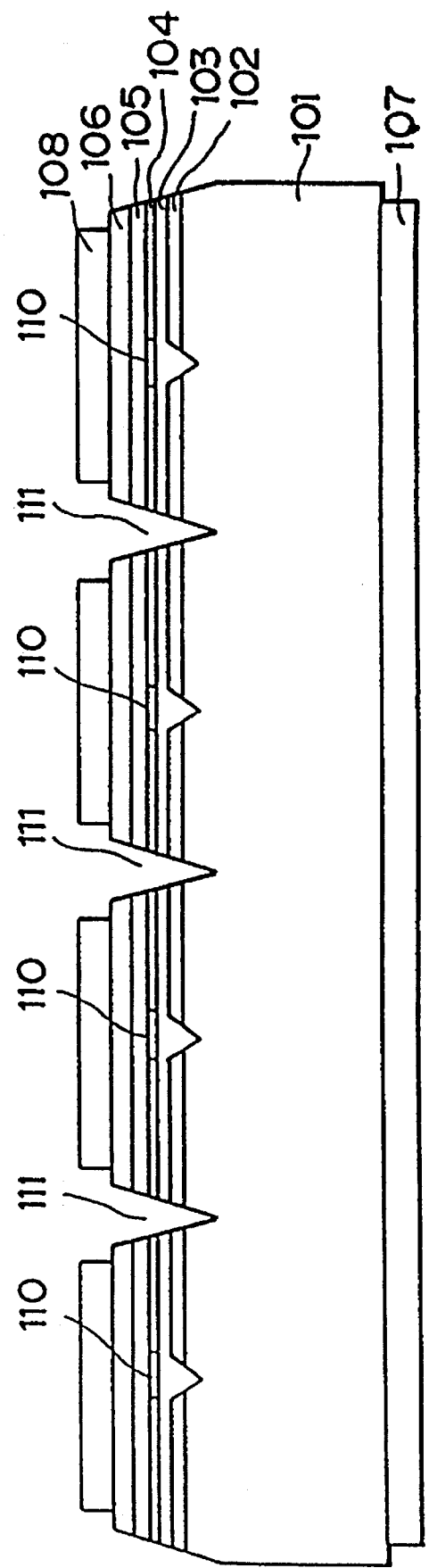
FIG. 4 is a drawing to show a conventional semiconductor laser array.
Figure 5:
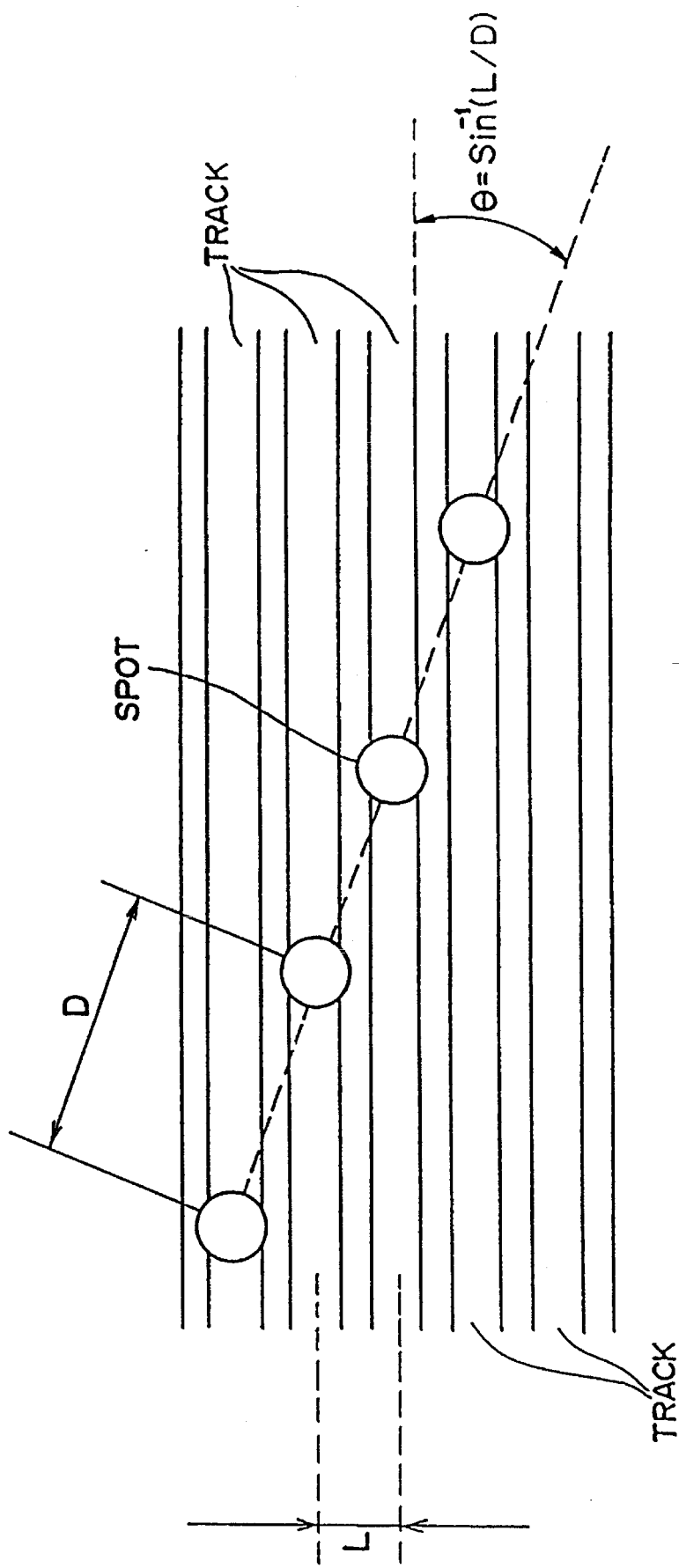
FIG. 5 is a drawing to show a positional relation between laser beams and tracks on a conventional record medium.
Figure 31:
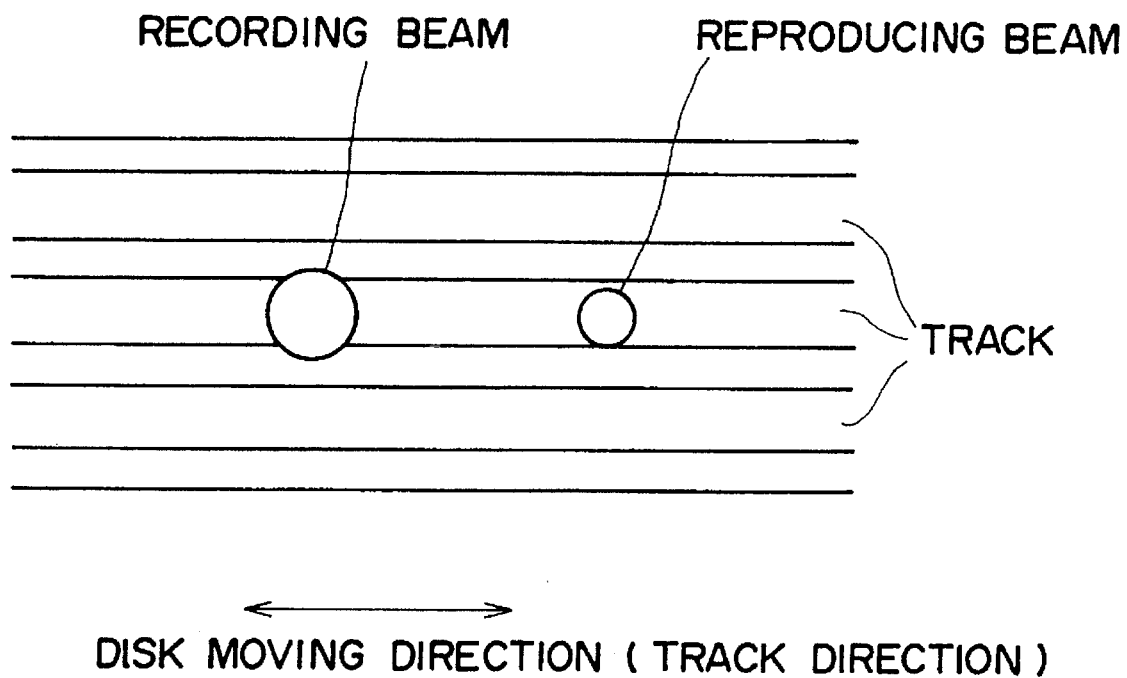
FIG. 31 is a drawing to show a positional relation between laser beams and tracks.

Next described is an example in which the semiconductor laser array of the present invention in FIG. 28 is employed as a light source in an optical information recording/reproducing apparatus. The optical system is the same as in the conventional example in FIG. 1, and therefore is omitted in the explanation herein. FIG. 31 shows the positional relation between tracks and beams on a record medium. A recording beam with a wider stripe width and a reproducing beam with a narrower stripe width are aligned on a same track such that the reproducing beam can verify recorded information immediately after the recording beam has recorded the information. The two beams are guided through the common optical system to the record medium, as shown in FIG. 1. Since the beam wavelength difference is small and the difference of astigmatic difference is also small between two outputs, the relative defocus may be minimized between the beams. In other words, this arrangement lowers neither the recording performance nor the reproducing performance.

The difference of stripe width can be evaluated as a beam divergence angle $\Theta\|$ of full-width at half maximum (FWHM) of a far field pattern in the direction parallel to the junction plane in the semiconductor laser. Since the stripe width is about 3 µm to 6 µm at most, the beam divergence angle increases by diffraction as the stripe width becomes narrower.

Figure 30:
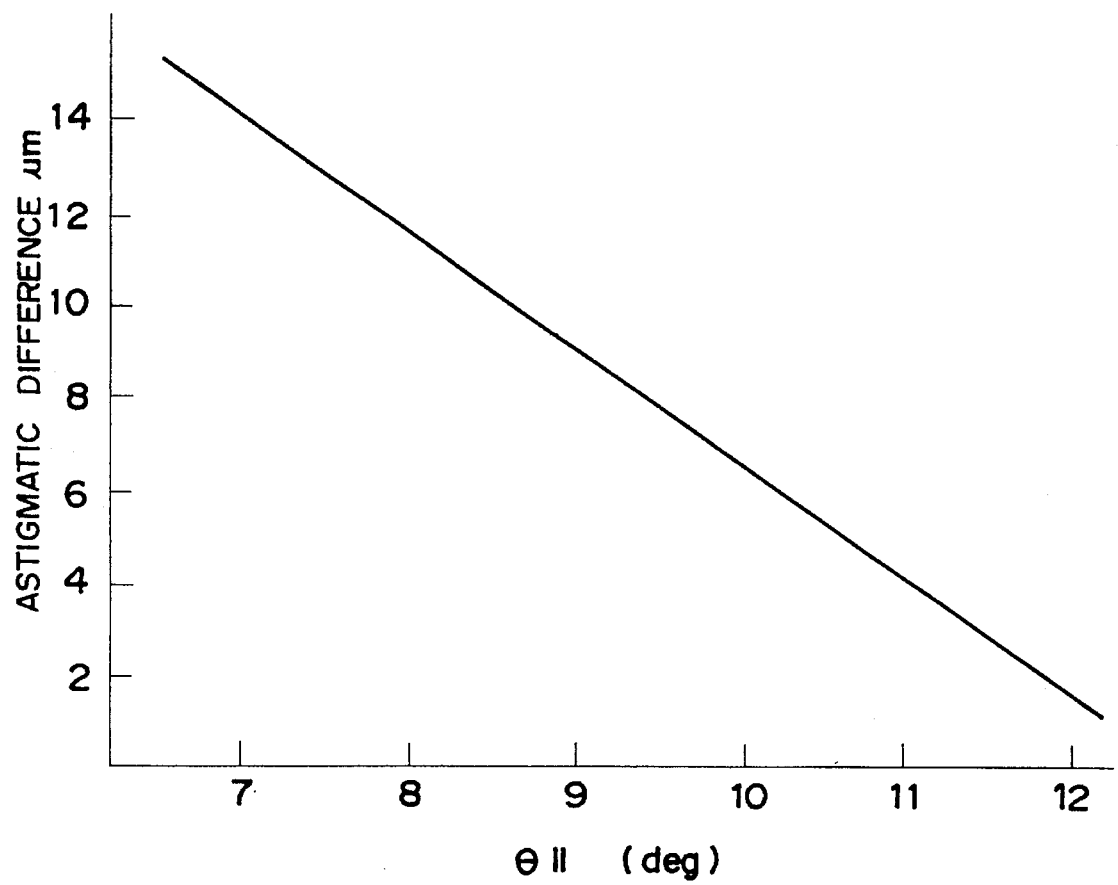
FIG. 30 is a drawing to show a relation between astigmatic difference and $\Theta\|$.

FIG. 30 shows an empirically obtained relation between $\Theta\|$ and the astigmatic difference in reproduction power. If the light power of a high-output laser is more than 200 mW to 30 mW necessary for recording, the astigmatic difference thereof is lower by about 4–5 µm than that caused in lower power of about 3 mW. Considering the permissible value of astigmatic difference as being within 10 µm, $\Theta\|$ of a high-output laser is desirably 7 degrees to 9 degrees from FIG. 30. On the other hand, $\Theta\|$ is desirably 10 degrees or more in reproduction, because the astigmatic difference is expected to be as small as possible.

If the semiconductor laser array is so arranged as to comprise a reproduction low power laser with $\Theta\|$ (beam divergence angle of FWHM of a far field pattern in the direction parallel to the junction plane) of 10 degrees ore more and a record high power laser with $\Theta\|$ of 7 degrees to 9 degrees, as described above, the array can give full play to its feature as a light source for optical information recording and reproduction.

Figure 32:
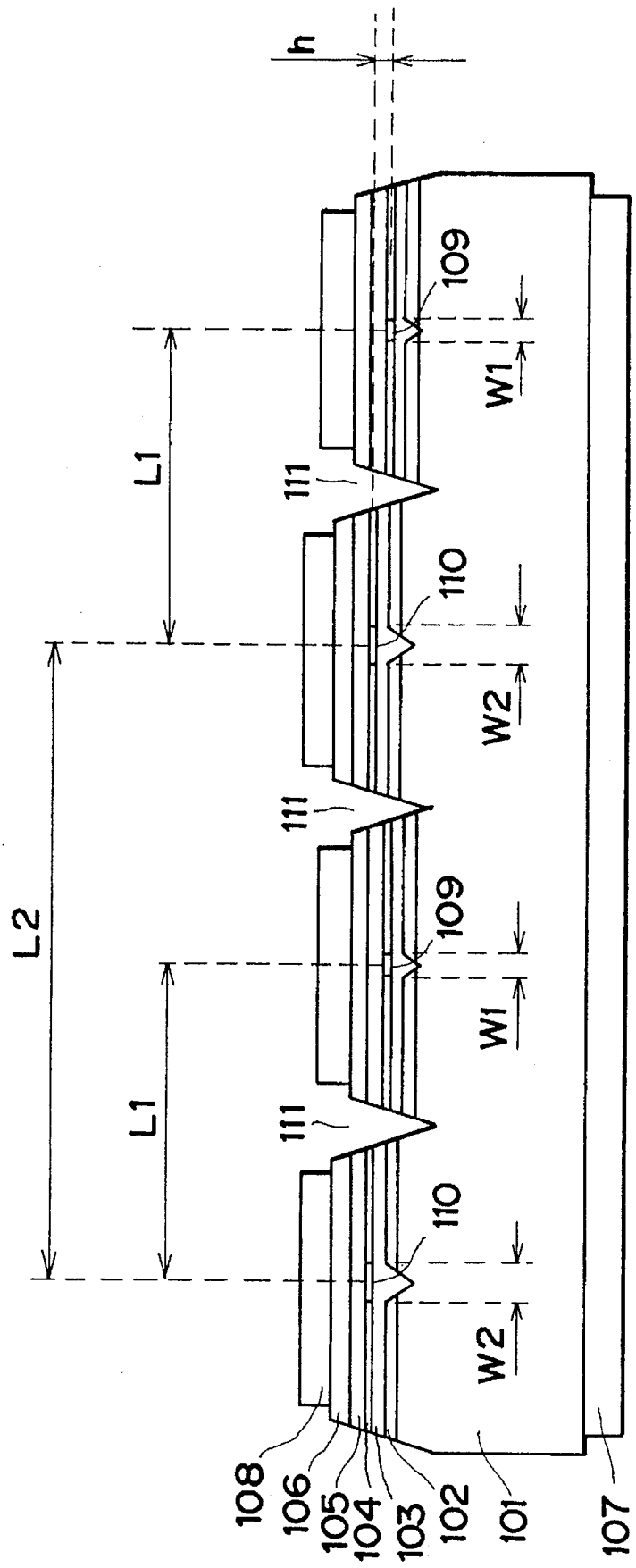
FIG. 32 is a drawing to show an embodiment of a semiconductor laser array of the present invention.

FIG. 32 shows an embodiment of a semiconductor laser array with four beams according to the present invention. In FIG. 32, the same numerals denote the same elements as those in FIG. 28.

Figure 33:
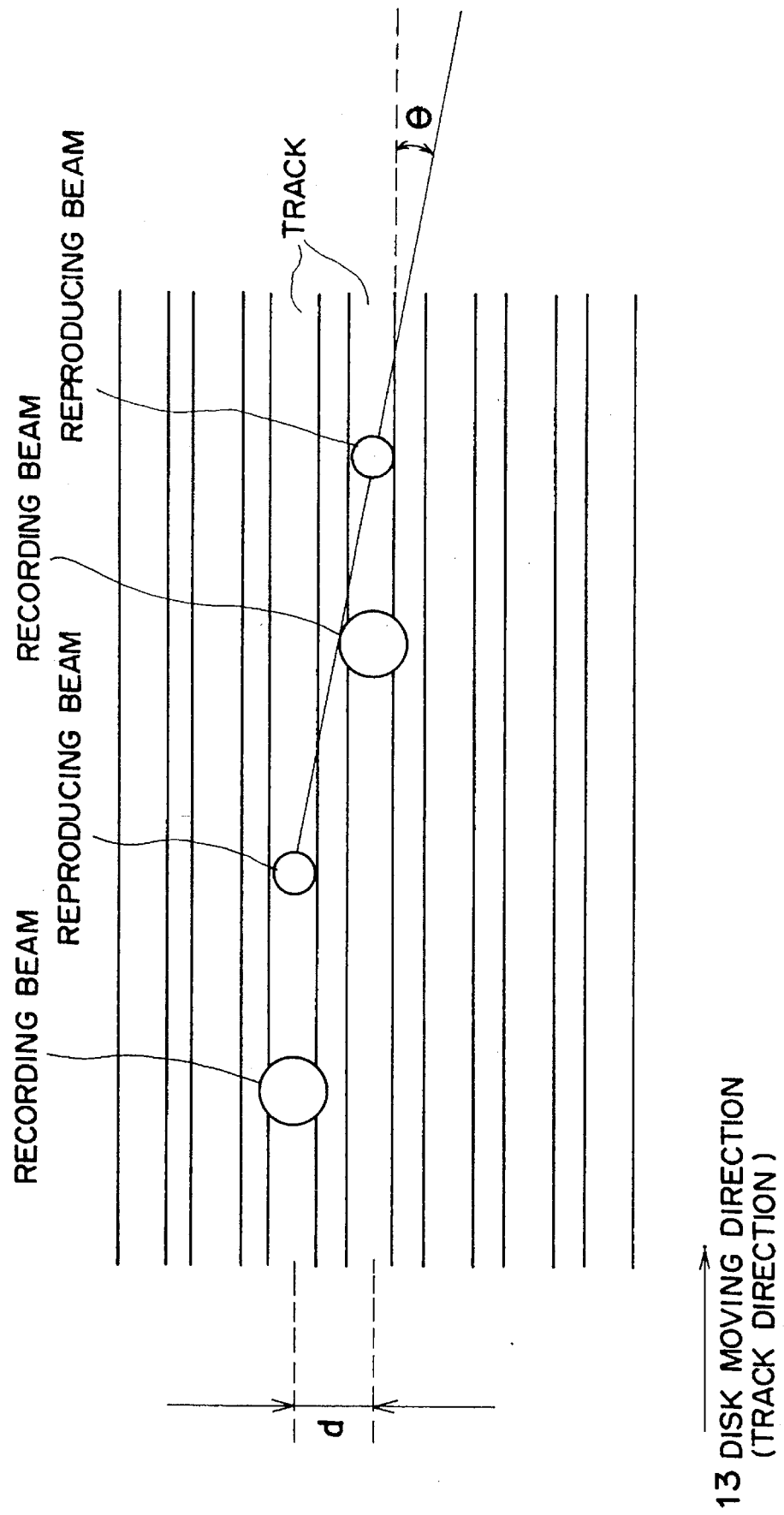
FIG. 33 is a drawing to show a positional relation between laser beams and tracks.

Four lasers integrated in a monolithic manner on a common substrate are two recording lasers with wider stripe width and two reproducing lasers with narrower stripe width, alternately arranged from the left to form two pairs thereof. The two pairs are arranged such that a distance between the radiative points in each pair is equal to L1. A distance between the recording lasers is L2. The height of radiative points is determined such that there is a height difference h between the recording radiative points 110 and the reproducing radiative points 109. FIG. 33 shows the relation between tracks of a record medium and beams in a case that the semiconductor laser array so arranged is employed in the optical information recording/reproducing apparatus shown in FIG. 8. A pair of a recording beam and a reproducing beam can be located on a same track by rotating the junction plane of lasers by $\Theta = \tan^{-1}$ (h/L1) about the optical axis. Another pair of a recording beam and a reproducing beam can also be located on an adjacent track at the same time. If a lateral magnification of an optical system from the light source to tracks is β and if a distance between tracks is d, L2 may be determined to satisfy the relation of $d = \beta \cdot L2 \cdot \tan\Theta$. Such an arrangement of four beams permits verification immediately after recording on two tracks in parallel, whereby the high-speed transfer rate can be further enhanced. Further increase of the transfer rate is similarly possible by increasing the number of beams, i.e., by forming two pairs, three pairs, or more, each pair of which is comprised of the stepped lasers for a recording beam and for a reproducing beam.

Figure 34:
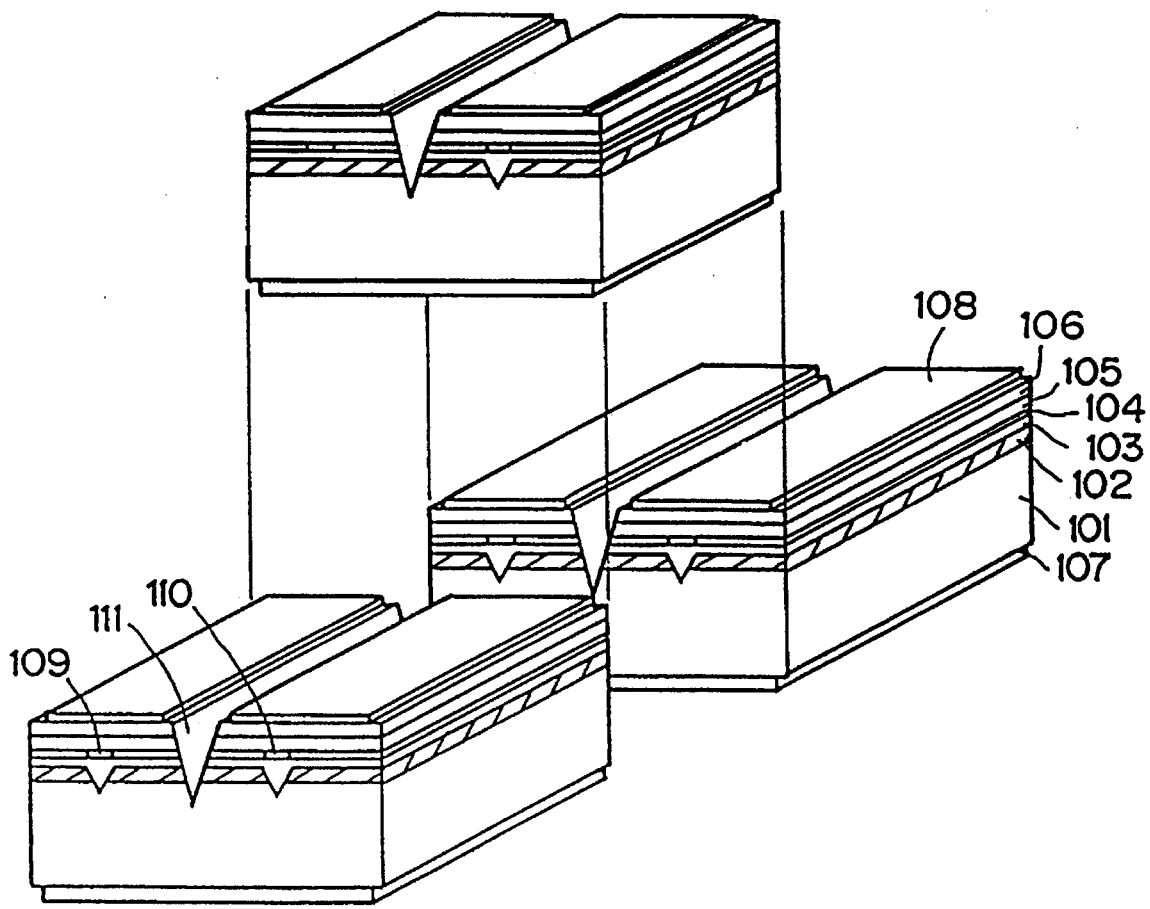
FIG. 34 is a drawing to show an embodiment of a semiconductor laser array of the present invention.

FIG. 34 is a constitutional drawing to show an embodiment of a semiconductor laser array of the present invention. In FIG. 34, the same numerals denote the same elements as those in the conventional example.

Next described is the process for forming the semiconductor laser array of the present invention. First crystal growth is done to form a block layer 102 on a flat substrate 101. The block layer 102 is then etched to form grooves for inner stripes at intervals of about 100 µm in stripe width (W2) so that one of the stripes has a region interrupted in the resonator. FIG. 34, partly drawn up, shows the condition that the groove of the left laser is interrupted in the resonator and that the active layer 104 is electrically intercepted from the substrate 101 by the block layer 102. Second crystal growth is then done to form layers 103 to 106. Since the first clad layer 103 preferentially fills up the etched grooves, which is the feature of liquid phase epitaxy, the surface thereof is substantially flat over the grooves. Accordingly, crystals grow to form layers substantially parallel to the substrate 101 after the fourth layer, i.e., the active layer 104, the second clad layer 105, and the cap layer 106. The first and second clad layers and the active layer therebetween constitute a double hererojunction to be a laser waveguide. Then, etching is effected over the cap layer to form a separation groove 111 reaching the substrate 101 at the middle position between the radiative points, which electrically separates the integrated laser waveguides. A cathode electrode 108 is formed on each of the n-type cap layers 106 separated by the separation groove 111, while an anode electrode 107 is formed on the bottom surface of a p-type substrate.

When a voltage is applied between the electrodes, the current flowing between the electrodes is constricted by the block layer 102, whereby the current is effectively injected into the limited region of an active layer on grooves to oscillate the laser. However, the active layer region having the interrupted groove in the resonator is a light absorbing region (saturable absorption region), which requires more current for laser oscillation. Namely, a threshold current becomes larger there. The radiative portion is located on the active layer 104 while the block layer 102 is located over the etched grooves. Numeral 109 represents a radiative portion having a light absorbing region inside the resonator and 110 a radiative portion having no light absorbing region inside the resonator. Since the cathode electrodes on the cap layer 106 are separate from each other by the separation groove 111, an arbitrary laser can be independently driven by turning on and off a corresponding cathode electrode.

Figure 35:
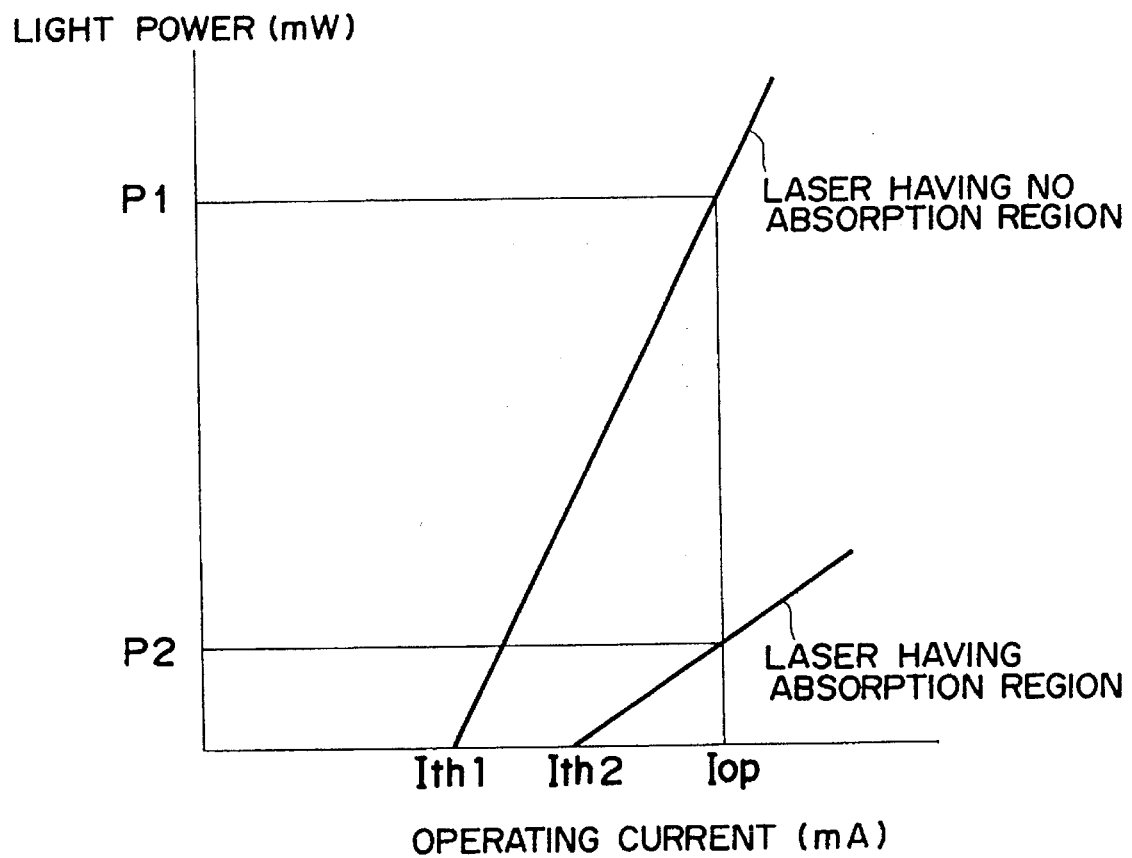
FIG. 35 is a drawing to show a relation between light power and operation current of a semiconductor laser.

The laser characteristic can be controlled by providing a light absorbing region inside the resonator as described above. FIG. 35 shows the relation between light output power and operation current in the semiconductor laser array of the present invention. If the stripe groove is interrupted inside the laser resonator, the active layer in that region serves as a light absorbing region to increase the threshold current (Ith2). Accordingly, the operation current becomes greater as compared with the laser with a continuous groove (radiative portion 110), which is the right laser in FIG. 34. This results in the left laser requiring almost the same operation current (Iop) in low power operation as that in high power operation of the right laser.

Since the oscillation wavelength of the laser is shifted to the longer wavelength side with a temperature rise of an active layer, it is considered that the oscillation wavelengths are almost equal to each other with the same operation current. If P1 is a recording power and P2 a reproducing power in FIG. 35, the wavelength difference between the two lasers can be made smaller.

As described above, the semiconductor laser array of inner stripe type is so arranged that a laser with or interrupted stripe groove inside the resonator is operated only for reproduction and that a laser with an uninterrupted stripe groove is for recording as the wavelength difference is kept small, whereby the light source for optical information recording and reproduction may be provided with little relative defocus after the beams have passed through a common optical system.

Incidentally, a laser having a light absorbing region in a waveguide shows a multi-mode spectrum by a so-called self-oscillation. Thus, the coherence of the laser is lowered, which is advantageous in that the return light induced noise is hardly produced. This allows one to expect an advantage that the external additional circuit such as the high-frequency overlay circuit can be obviated.

Although the light absorbing region is formed by interrupting the stripe groove in the resonator in the above embodiment, any saturable absorption region in the waveguide can present the same effect. For example, a cathode electrode can be divided in the direction of the resonator to stop the current flow into a portion of the active layer, which provides the same result. Also, a small light absorbing region can be formed over the entire region of the waveguide, providing the same result.

Described below is an example in which the semiconductor laser array of the present invention in FIG. 34 is employed as a light source in an optical information recording/reproducing apparatus. The optical system is the same as that in the conventional example in FIG. 1, and is therefore omitted in the explanation herein. The positional relation between a track of a record medium and two beams is the same as that shown in FIG. 31. A beam from the recording laser with a continuous stripe groove and a beam from the reproducing laser with an interrupted stripe groove are aligned on a same track, so that the reproducing beam can verify recorded information immediately after the recording beam has recorded the information. The two beams are guided through the common optical system to the record medium, as shown in FIG. 1. Since the wavelength difference is small between the beam output from the lasers, the relative defocus can be minimized between the beams. In other words, the arrangement lowers neither the recording performance nor the reproducing performance.

Figure 36:
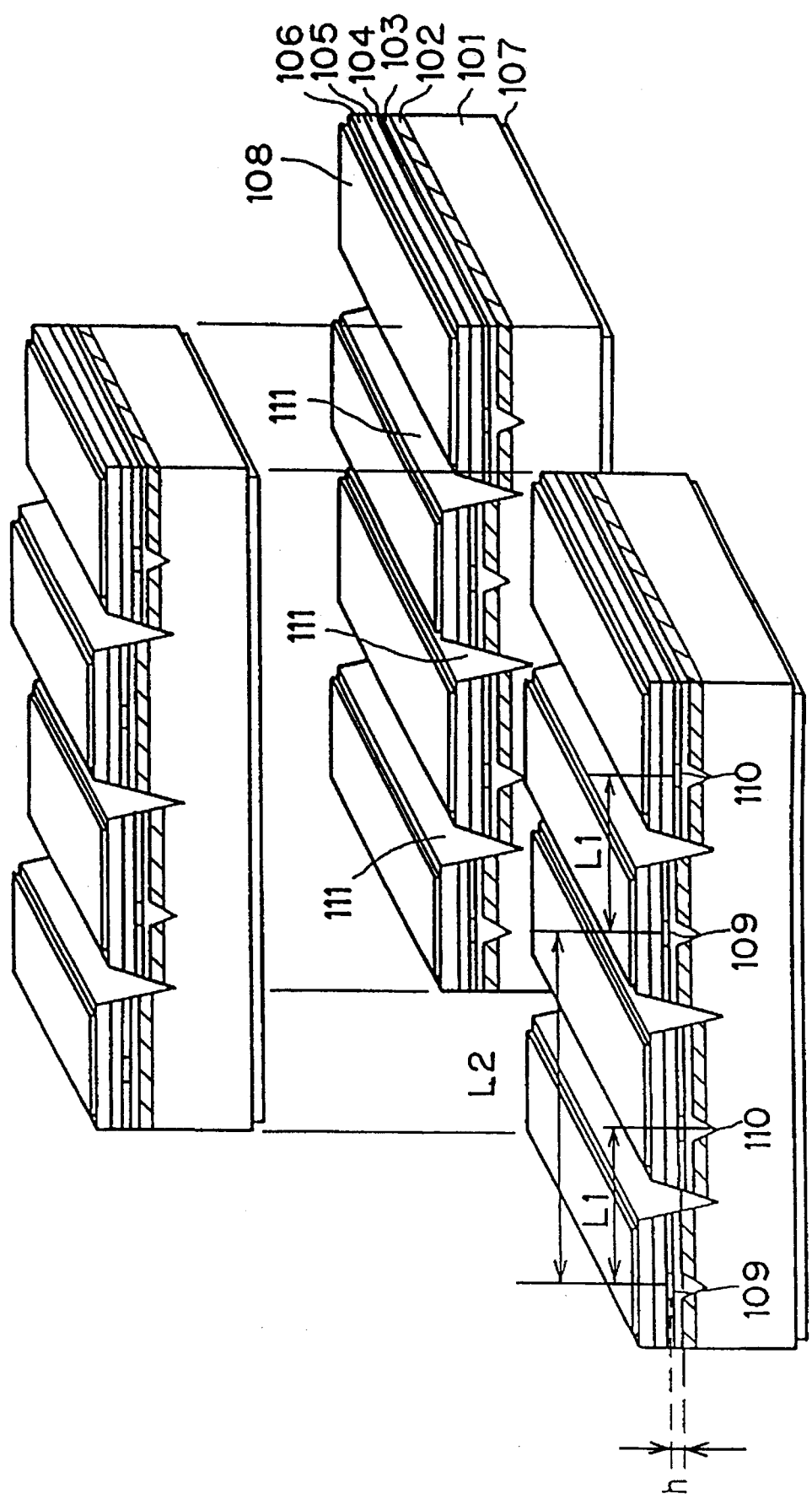
FIG. 36 is a drawing to show an embodiment of a semiconductor laser array of the present invention.

FIG. 36 shows an embodiment of a semiconductor laser array with four beams according to the present invention. In FIG. 36, the same numerals denote the same elements as those in FIG. 34.

Four lasers integrated in a monolithic manner on a common substrate are two reproducing lasers with an interrupted stripe groove and two recording lasers with a continuous stripe groove, arranged alternately from the left to form two pairs thereof. The two pairs are arranged such that a distance between radiative points in each pair is equal to L1. A distance between reproducing or recording lasers is L2. Further, the heights of radiative points are determined such that there is a height difference h between the recording lasers 110 and the reproducing lasers 109.

If such a semiconductor laser array is employed as a light source in the optical information recording/reproducing apparatus shown in FIG. 8, the relation between tracks of the record medium and beams is the same as that in FIG. 33. A pair of a recording beam and a reproducing beam can be aligned on a same track by rotating the junction plane of laser by $\Theta = \tan^{-1}(h/L1)$ about the optical axis. Another pair of a recording beam and a reproducing beam also can be aligned on an adjacent track at the same time. If a lateral magnification of the optical system from the light source to tracks is $\beta$ and if a distance between tracks is d, then the relation of $d = \beta \cdot L2 \cdot \tan\Theta$ is satisfied. Such an arrangement of four beams enables the verification immediately after recording in parallel on two tracks, which further increases the high-speed transfer rate. A further increase of transfer rate is similarly possible by increasing the number of beams, i.e., by forming two pairs, three pairs, or more, each of which is composed of the stepped lasers for a recording beam and for a reproducing beam.

Figure 37:
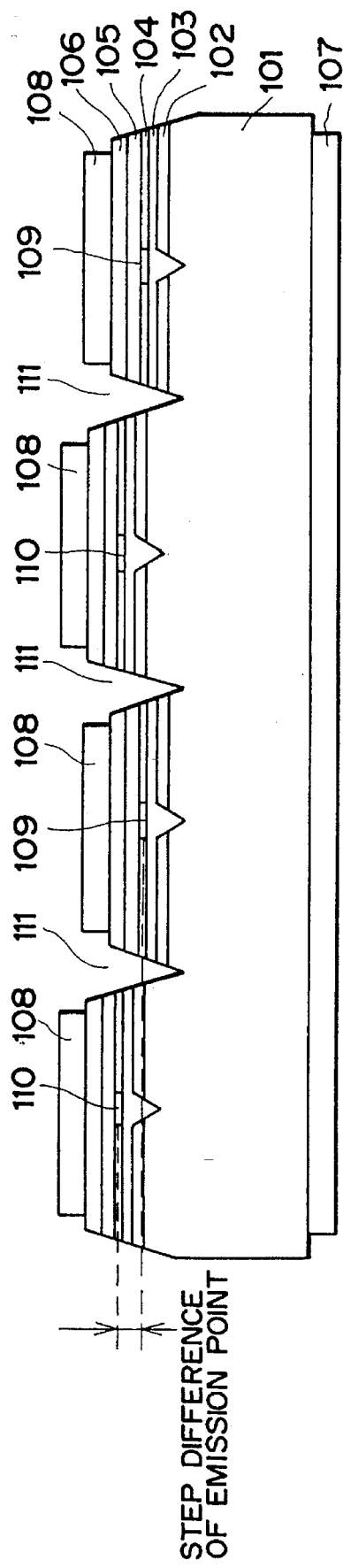
FIG. 37 is a drawing to show an embodiment of a semiconductor laser array of the present invention.

FIG. 37 is a constitutional drawing to show an embodiment of a semiconductor laser array of the present invention.

In FIG. 37, the same numerals denote the same elements as those in the conventional example.

Figure 38A:
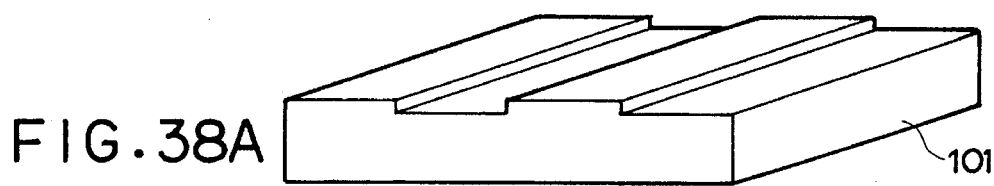
FIG. 38A to FIG. 38F are drawings to illustrate the production process of a semiconductor laser array of FIG. 37.
Figure 38B:
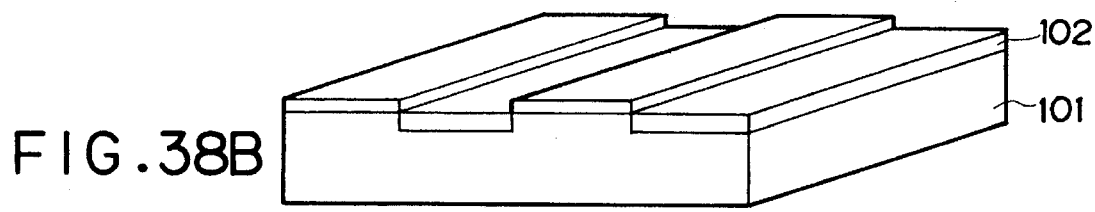
Figure 38C:
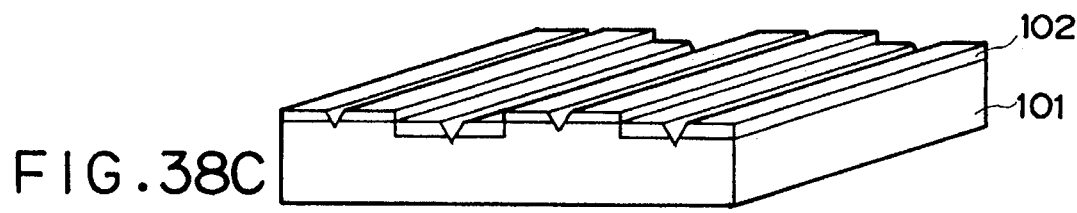
Figure 38D:
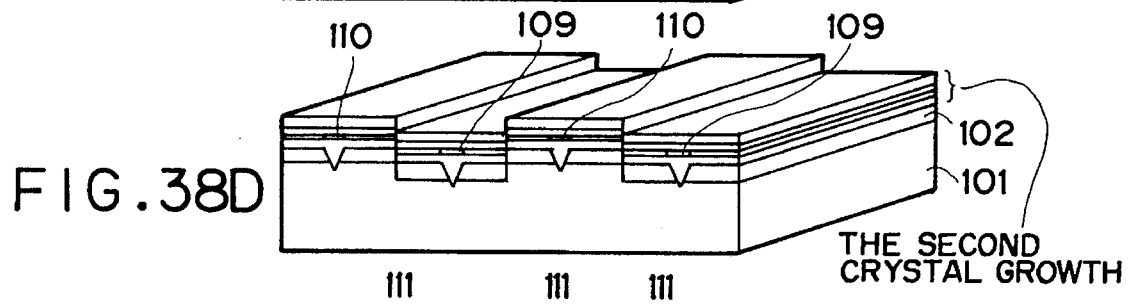
Figure 38E:
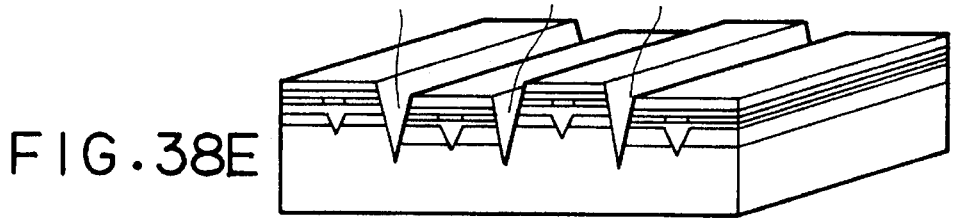
Figure 38F:
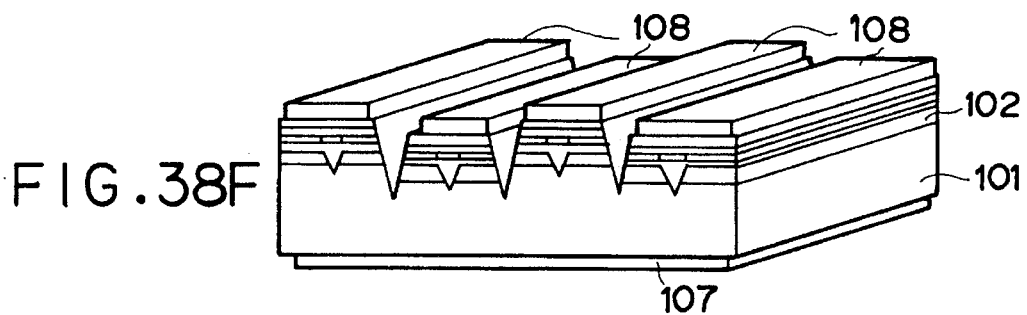

Next described with reference to FIGS. 38A–38F is a process for producing a monolithic integrated semiconductor laser array of the present invention. First, alternate steps are produced in a difference of several μm to several tens of μm on a substrate 101 as shown (FIG. 38A). First crystal growth is done to form a block layer 102 in uniform thickness on the stepped substrate 101. The surface of block layer 102 also has steps similar to the stepped configuration of substrate 101 (FIG. 38B). Then, etching is effected in a stripe pattern on the block layer 102 to form grooves for inner stripes reaching the substrate 101 at intervals of about 100 μm. Since the thickness of block layer 102 is even, all stripes are etched in substantially the same depth reaching the substrate in spite of existence of steps if the stripe width is the same (FIG. 38C). Then, second crystal growth is done to form layers 103–106. Since the first clad layer 103 preferentially fills up the etched grooves, which is the feature of liquid phase epitaxy, the surface thereof is substantially flat over the grooves. The flat portion of the first clad layer 103 over the grooves also has steps following the surface of the substrate 101, similarly as the block layer 102. After the fourth layer, crystals grow to form layers following the steps of substrate 101. The radiative portion is in the active layer 104 on the center line of etched grooves in block layer 102. Namely, the radiative points 109, 110 are formed at stepped heights along the steps of substrate 101 (FIG. 38D). Etching is next effected over the cap layer to electrically separate the integrated radiative points, so that electrode separation grooves 111 reaching the substrate 101 are formed at middle positions between the radiative points (FIG. 38E). A cathode electrode 108 is formed on each of the n-type cap layers 106 separated by the separation grooves 111, while an anode electrode 107 is formed on the bottom surface of a p-type substrate (FIG. 38F).

When a voltage is applied between the electrodes, a current flowing between the electrodes is constricted by the block layer 102, whereby the current is efficiently injected into the limited region of an active layer on grooves to oscillate the laser. As so arranged, a monolithic integrated semiconductor laser can be provided, in which a plurality of radiative points are arranged at stepped heights following the surface steps of substrate 101 with respect to the bottom surface of substrate 101 and can be driven independent of each other.

FIG. 39 shows the positional relation between tracks on a record medium and spots, where the monolithic semiconductor laser array of the present invention is employed in the optical information recording/reproducing apparatus shown in FIG. 1. The spots are depicted in a size representing the difference of height from the bottom surface of a substrate. Supposing a distance between spots on a record medium corresponding to the radiative points at the same height from the substrate bottom surface is D' and the track pitch of the record medium is L, a pair of spots different in height from the substrate bottom surface can be positioned on a same track by rotating the line of laser beams by $\Theta'=\sin^{-1}(L/D')$ with respect to the track direction. Another pair of spots may be similarly positioned on an adjacent track at the same time. Arranging the positional relation between the spots and the tracks, recording and reproduction can be simultaneously carried out with two spots positioned on a same track, so that the recording operation can be completed with a rotation of the disk. In addition, such an arrangement enables parallel processing on a plurality of tracks, which remarkably enhances the recording performance, specifically the transfer rate of the optical information recording/reproducing apparatus.

FIG. 40 shows the embodiment of another semiconductor laser array with stepped radiative points according to the present invention. The present embodiment is an example in which steps are formed such that two adjacent radiative points have the same height from the bottom surface of the substrate. In FIG. 40, the radiative points 110 are formed at the same height and the radiative points 109 are lower by the step difference of the substrate than the radiative points 110. The process for producing the lasers is the same as in FIGS. 38A–38F, but only the pattern of arrangement of the substrate steps is different from that in FIGS. 38A–38F. The object of the present invention can also be achieved by the arrangement of steps in the present embodiment.

Figure 41:
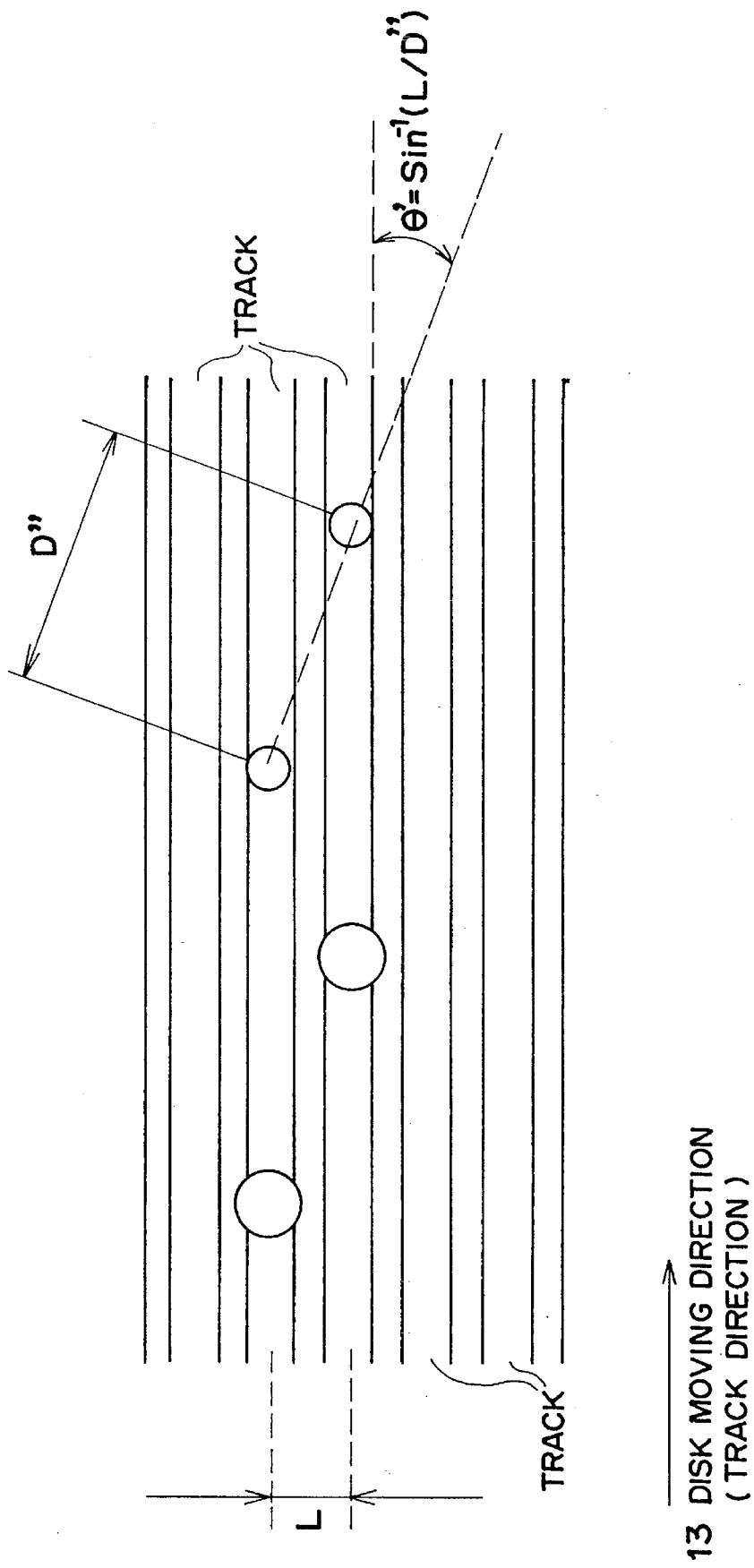
FIG. 41 is a drawing to show a positional relation between laser beams and tracks.

FIG. 41 shows the positional relation between tracks on a record medium and spots, where the monolithic semiconductor laser array of the present invention is employed as a light source in the optical information recording/reproducing apparatus shown in FIG. 1, which is described below in detail. In FIG. 41, the size of the spots represents the difference in height of spots from the bottom surface of the substrate. If a distance between spots on the medium corresponding to the radiative points at the same height from the substrate bottom surface is D" and if the track pitch of the record medium is L, then a pair of spots different in height from the substrate bottom surface can be positioned on a same track and another pair of spots similarly on an adjacent track at the same time by rotating the line of laser beams by $\Theta'=\sin^{-1}(L/D'')$ with respect to the track direction. Such an arrangement of positional relation between spots and tracks enables the simultaneous recording and reproduction with two spots on a same track, so that the recording operation can be completed within a rotation of a disk. In addition, parallel processing is also possible on a plurality of tracks, which remarkably enhances the recording performance, specifically the transfer rate of an optical information recording/reproducing apparatus.

Although the above embodiments showed the examples of four beams, using an even number of beams over four beams of course increases the number of tracks which can be processed in parallel, further increasing the transfer rate.

As described above, the optical recording/reproducing apparatus of the present invention can increase the transfer rate, as being three times faster than the data transfer rate in writing by the conventional magneto-optical disk apparatus if two light spots are formed on a single track to carry out overwrite and direct verification, or as being six times faster than that if the overwrite and direct verification are done on two tracks in parallel. Also, the present invention can achieve the high transfer rate, using the simple and cheap optical system substantially identical to the conventional magneto-optical disk apparatus using a single light source.

Also, as described above, the semiconductor laser array of inner stripe type may be arranged such that a plurality of lasers are provided on a common substrate as can be driven independent of each other and that the lasers have different stripe widths, whereby the relative defocus can be reduced between the beams, which can prevent the recording performance and reproducing performance of the optical information recording/reproducing apparatus from being degraded. Also, discriminating the recording stripe width from the reproducing stripe width enables the recording laser to have the high-output property more easily than in the conventional apparatus. This permits the rotation number of the record medium to be increased, which in turn increases the transfer rate and remarkably improves the performance of the optical information recording/reproducing apparatus.

Further, as described above, the semiconductor laser array of inner stripe type may be arranged such that a plurality of lasers are formed on a common substrate as can be driven independent of each other and that the plural lasers comprise low power lasers having a saturable absorption region in a waveguide and high power lasers having no saturable absorption region in the waveguide, whereby the relative defocus can be minimized between the beams, which can prevent the recording performance and the reproducing performance in the optical information recording/reproducing apparatus from being lowered.

Furthermore, as described with the foregoing embodiments, the semiconductor laser of double heterojunction type may be so arranged that a plurality of lasers are formed on a common substrate as can be independently driven and that the lasers are positioned at different heights from the substrate bottom surface to the active layer, whereby two spots can be positioned on a same track in the optical information recording/reproducing apparatus to enable the simultaneous recording and reproduction and thereby to complete the recording operation within a rotation of a disk. In addition, parallel processing is also possible on a plurality of tracks, whereby the recording performance of an optical information recording/reproducing apparatus, specifically the transfer rate, can be remarkably improved.

What is claimed is:

1. An optical recording/reproducing apparatus comprising:
   a semiconductor laser having a plurality of radiative portions, said plurality of radiative portions being formed at different heights in a direction perpendicular to a junction plane on a same substrate; and
   spot forming means for arranging beams from the plurality of radiative portions in said semiconductor laser to form a plurality of light spots on an information recording medium for effecting information recording and reproduction.

2. An optical recording/reproducing apparatus according to claim 1, wherein said spot forming means concurrently forms a first recording light spot and a first reproducing light spot on a first information track on the information recording medium and concurrently forms a second recording light spot and a second reproducing light spot on a second information track different from the first information track on the information recording medium.

3. An optical recording/reproducing apparatus according to claim 1, wherein the plurality of radiative portions have different widths in a direction parallel to the junction plane.

4. An optical recording/reproducing apparatus comprising:
   a semiconductor laser having a plurality of radiative portions; and
   spot forming means for arranging beams from the plurality of radiative portions in said semiconductor laser to form a plurality of light spots on an information recording medium for effecting information recording and reproduction, wherein said spot forming means concurrently forms a first recording light spot and a first reproducing light spot on a first information track on the information recording medium and concurrently forms a second recording light spot and a second reproducing light spot on a second information track different from the first information track on the information recording medium.

5. An optical recording/reproducing apparatus according to claim 4, wherein said plurality of radiative portions are formed at different heights in a direction perpendicular to a junction plane on the same substrate.

6. An optical recording/reproducing apparatus according to claim 5, wherein the plurality of radiative portions have different widths in a direction parallel to the junction plane.

7. An optical recording/reproducing apparatus according to claim 5, wherein the plurality of radiative portions have different widths in a direction parallel to the junction plane.

8. An optical recording/reproducing apparatus comprising:
   a semiconductor laser having a plurality of radiative portions, said plurality of radiative portions having different widths in a direction parallel to a junction plane; and
   spot forming means for arranging beams from the plurality of radiative portions in said semiconductor laser to form a plurality of light spots on an information recording medium for effecting information recording and reproduction,
   wherein the plurality of radiative portions comprise a first radiative portion which has a beam divergence angle of 10 degrees or more and a second radiative portion which has a beam divergence angle of 7 degrees to 9 degrees, said beam divergence angle being of a full-width at half maximum of a far field pattern in the direction parallel to the junction plane.

9. An optical recording/reproducing apparatus comprising:
   a semiconductor laser having a first radiative portion and a second radiative portion which have different widths in a direction parallel to a junction plane, a full-width at half maximum of a far field pattern in a direction parallel to the junction plane in the first radiative portion being 10 degrees or more and a full-width at half maximum of a far field pattern in the direction parallel to the junction plane in the second radiative portion being within a range of 7 degrees to 9 degrees; and
   spot forming means for arranging beams from the first and second radiative portions in said semiconductor laser to form a plurality of light spots on an information recording medium for effecting information recording and reproduction.

10. An optical recording/reproducing apparatus comprising:
    a semiconductor laser having a plurality of radiative portions of a laser resonator, said plurality of radiative portions comprising a first radiative portion having a saturable absorption region in the laser resonator, and a second radiative portion having no saturable absorption region in the laser resonator; and
    spot forming means for arranging beams from the plurality of radiative portions in said semiconductor laser to form a plurality of light spots on an information recording medium for effecting information recording and reproduction.

11. An optical recording/reproducing apparatus comprising:
    a semiconductor laser having a plurality of radiative portions of laser resonators, said plurality of radiative portions comprising a first radiative portion having a saturable absorption region in a respective laser resonator and a second radiative portion having no saturable absorption region in a respective laser resonator; and
    spot forming means for arranging beams from the plurality of radiative portions in said semiconductor laser to form a plurality of light spots on an information recording medium for effecting information recording and reproduction.

12. An optical recording/reproducing apparatus comprising:
 a semiconductor laser having a plurality of radiative portions; and
 spot forming means for arranging beams from the plurality of radiative portions in said semiconductor laser to form a plurality of light spots on an information recording medium for effecting information recording and reproduction, wherein said spot forming means concurrently forms a plurality of first light spots on a first information track on the information recording medium and concurrently forms a plurality of second light spots on a second information track different from the first information track on the information recording medium.

13. An optical recording/reproducing apparatus according to claim 12, wherein said plurality of radiative portions are formed at different heights in a direction perpendicular to a junction plane on the same substrate.

14. An optical recording/reproducing apparatus according to claim 13, wherein the plurality of radiative portions have different widths in a direction parallel to the junction plane.

15. An optical recording/reproducing apparatus according to claim 13, wherein the plurality of radiative portions have different widths in a direction parallel to the junction plane.

16. An optical recording/reproducing apparatus comprising:
 a semiconductor laser having a radiative portion for recording and a radiative portion for reproduction, said radiative portions for recording and for reproduction being formed at different heights in a direction perpendicular to a junction plane on the same substrate; and
 spot forming means for arranging beams from the radiative portions in said semiconductor laser to form a plurality of light spots on an information recording medium for effecting information recording and reproduction.

17. An optical recording/reproducing apparatus according to claim 16, wherein said spot forming means concurrently forms a first recording light spot and a first reproducing light spot on a first information track on the information recording medium and concurrently forms a second recording light spot and a second reproducing light spot on a second information track different from the first information track on the information recording medium.

18. An optical recording/reproducing apparatus according to claim 16, wherein the plurality of radiative portions have different widths in a direction parallel to the junction plane.

* * * * *

UNITED STATES PATENT AND TRADEMARK OFFICE
CERTIFICATE OF CORRECTION

PATENT NO. : 5,608,716
DATED : March 4, 1997
INVENTOR(S) : OSAMU KOYAMA, ET AL.

It is certified that error appears in the above-indentified patent and that said Letters Patent is hereby corrected as shown below:

ON THE COVER PAGE:

At [57] ABSTRACT

Line 7, "record" should read --recording--.

COLUMN 8

Line 51, " $d''=(f_2/f_1)d^1=P$ " should read -- $d''=(f_2/f_1)d' \simeq P$ --.

COLUMN 11

Line 54, "e" should read --θ--.
Line 59, "$f_1)d'=P]$." should read --$f_1)d' \simeq P$].--.

COLUMN 16

Line 10, "require" should read --requires--.

UNITED STATES PATENT AND TRADEMARK OFFICE
CERTIFICATE OF CORRECTION

PATENT NO. : 5,608,716

DATED : March 4, 1997

INVENTOR(S) : OSAMU KOYAMA, ET AL.

It is certified that error appears in the above-indentified patent and that said Letters Patent is hereby corrected as shown below:

COLUMN 20

Line 18, "ore" should read --or--.

COLUMN 21

Line 58, "or" should read --an--.

Signed and Sealed this

Sixteenth Day of September, 1997

Attest:

BRUCE LEHMAN

Attesting Officer     Commissioner of Patents and Trademarks